US011355200B2

(12) United States Patent
Hansen et al.

(10) Patent No.: US 11,355,200 B2
(45) Date of Patent: Jun. 7, 2022

(54) HYBRID ROUTINE FOR A MEMORY DEVICE

(71) Applicant: Micron Technology, Inc., Boise, ID (US)

(72) Inventors: Shannon Marissa Hansen, Boise, ID (US); Fulvio Rori, Boise, ID (US); Andrea D'Alessandro, Avezzano (IT); Jason Lee Nevill, Boise, ID (US); Chiara Cerafogli, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/996,363

(22) Filed: Aug. 18, 2020

(65) Prior Publication Data

US 2022/0059173 A1    Feb. 24, 2022

(51) Int. Cl.
*G11C 16/20*      (2006.01)
*G11C 16/04*      (2006.01)
*G11C 16/24*      (2006.01)
*G11C 16/26*      (2006.01)
*G06F 3/06*       (2006.01)
*H01L 27/11582*   (2017.01)
*H01L 27/11556*   (2017.01)

(52) U.S. Cl.
CPC ............ *G11C 16/20* (2013.01); *G06F 3/0604* (2013.01); *G06F 3/0659* (2013.01); *G06F 3/0679* (2013.01); *G11C 16/0483* (2013.01); *G11C 16/24* (2013.01); *G11C 16/26* (2013.01); *H01L 27/11556* (2013.01); *H01L 27/11582* (2013.01)

(58) Field of Classification Search
CPC .................................................. G11C 11/406
USPC ........................................................ 711/170
See application file for complete search history.

(56) References Cited

U.S. PATENT DOCUMENTS

| 2007/0055854 | A1* | 3/2007 | Chang .................... | G11C 16/20 713/1 |
| 2012/0236628 | A1* | 9/2012 | Ikeda ................... | H01L 27/2409 365/148 |
| 2019/0295657 | A1* | 9/2019 | Maejima ............... | G06F 3/0604 |
| 2020/0402580 | A1* | 12/2020 | Kim ....................... | G11C 16/26 |

\* cited by examiner

*Primary Examiner* — Min Huang
(74) *Attorney, Agent, or Firm* — Schwegman Lundberg & Woessner, P.A.

(57) ABSTRACT

A variety of applications can include a memory device designed to perform sensing of a memory cell of a string of memory cells using a modified shielded bit line sensing operation. The modified shielded bit line sensing operation includes pre-charging a data line corresponding to the string with the string enabled to couple to the data line. The modified shielded bit line sensing operation can be implemented in a hybrid initialization routine for the memory device. The hybrid initialization routine can include a sensing read routine corresponding to an all data line configuration of data lines of the memory device and a modified sensing read routine corresponding to a shielded data line configuration of the data lines with selected strings enabled during pre-charging. A read retry routine associated with the modified sensing read routine can be added to the hybrid initialization routine. Additional devices, systems, and methods are discussed.

20 Claims, 12 Drawing Sheets

HYBRID ROUTINE FOR A MEMORY DEVICE

FIELD OF THE DISCLOSURE

Embodiments of the disclosure relate generally to memory devices and operation of memory devices, and more specifically, to read operations of memory devices.

BACKGROUND

Memory devices are typically provided as internal, semiconductor, integrated circuits in computers or other electronic devices. There are many different types of memory, including volatile and non-volatile memory. Volatile memory requires power to maintain its data, and includes random-access memory (RAM), dynamic random-access memory (DRAM), or synchronous dynamic random-access memory (SDRAM), among others. Non-volatile memory can retain stored data when not powered, and includes flash memory, read-only memory (ROM), electrically erasable programmable ROM (EEPROM), erasable programmable ROM (EPROM), resistance variable memory, such as phase-change random-access memory (PCRAM), resistive random-access memory (RRAM), magnetoresistive random-access memory (MRAM), or three-dimensional (3D) XPoint™ memory, among others. A 3D Xpoint memory is a non-volatile memory (NVM) technology with a stackable cross-grid data access array in which bit storage is based on a change of bulk resistance.

Flash memory is utilized as non-volatile memory for a wide range of electronic applications. Flash memory devices typically include one or more groups of one-transistor, floating gate or charge trap memory cells that allow for high memory densities, high reliability, and low power consumption. Two common types of flash memory array architectures include NAND and NOR architectures, named after the logic form in which the basic memory cell configuration of each is arranged. The memory cells of the memory array are typically arranged in a matrix. In an example, the gates of each floating gate memory cell in a row of the array are coupled to an access line (e.g., a word line). In a NOR architecture, the drains of each memory cell in a column of the array are coupled to a data line (e.g., a bit line). In a NAND architecture, the drains of each memory cell in a string of the array are coupled together in series, source to drain, between a source line and a data line.

In powering up a memory device, such as an individual NAND memory die, the memory device uses an initialization procedure to read configuration parameters stored in the memory device. The retrieval of these configuration parameters is performed before the NAND memory device can be begin operation in a system. The accuracy of reading these configuration parameters from memory storage on the individual memory die is important to operation of the memory device. As memory devices, such as NAND memory devices, are implemented in 3D architectures to provide increased capacity over planar structures, sources of potential errors in reading is increased. Providing enhanced techniques to address accuracy in reading of a memory device, such as in initialization of the memory device, can increase reliability of operating the memory device over its lifetime.

BRIEF DESCRIPTION OF THE DRAWINGS

The drawings, which are not necessarily drawn to scale, illustrate generally, by way of example, but not by way of limitation, various embodiments discussed in the present document.

DETAILED DESCRIPTION

Figure 1A:
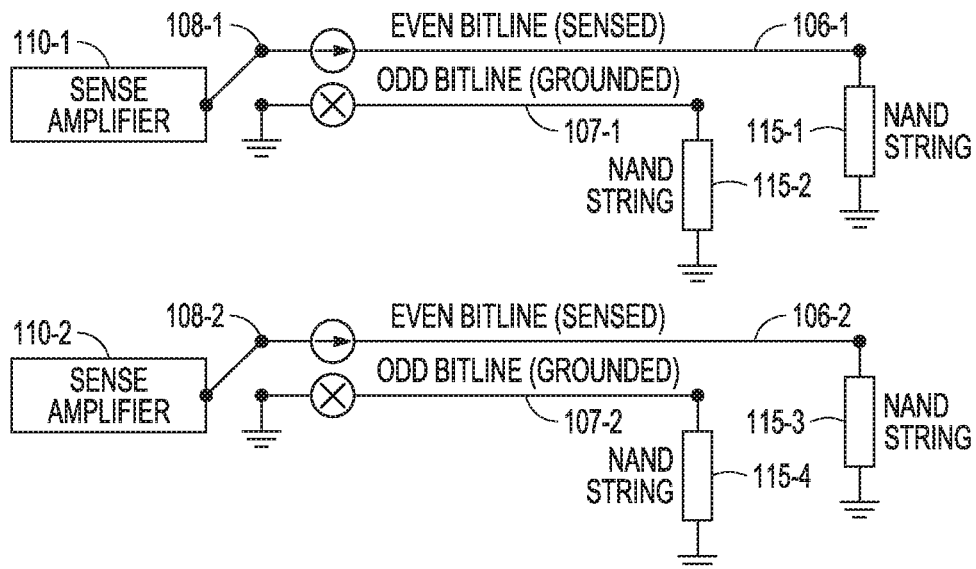
FIG. 1A illustrates an example arrangement of data lines with respect to sense amplifiers in an shielded bit line sensing configuration, according to various embodiments.

The following detailed description refers to the accompanying drawings that show, by way of illustration, various embodiments that can be implemented. These embodiments are described in sufficient detail to enable those of ordinary skill in the art to practice these and other embodiments. Other embodiments may be utilized, and structural, logical, mechanical, and electrical changes may be made to these embodiments. The various embodiments are not necessarily mutually exclusive, as some embodiments can be combined with one or more other embodiments to form new embodiments. The following detailed description is, therefore, not to be taken in a limiting sense.

Both NOR and NAND flash architecture semiconductor memory arrays of flash memory devices are accessed through decoders that activate specific memory cells by selecting an access line (WL) coupled to gates of specific memory cells. In a NOR architecture semiconductor memory array, once activated, the selected memory cells place their data values on data lines, causing different currents to flow depending on the state at which a particular cell is programmed. In a NAND architecture semiconductor memory array, a relatively high bias voltage is applied to a drain-side select gate (SGD) line. Access lines coupled to the gates of the unselected memory cells of each group are driven at a specified pass voltage (e.g., Vpass) to operate the unselected memory cells of each group as pass transistors (e.g., to pass current in a manner unrestricted by their stored data values). Current then flows in the line between the source line and the data line through each series-coupled group, restricted only by the selected memory cells of each group, placing current encoded data values of selected memory cells on the data lines.

Each flash memory cell in a NOR or NAND architecture semiconductor memory array can be programmed to one or a number of programmed states. For example, a single-level cell (SLC) can represent one of two programmed states (e.g., 1 or 0), representing one bit of data. Flash memory cells can also represent more than two programmed states, allowing the manufacture of higher density memories without increasing the number of memory cells, as each cell can represent more than one binary digit (e.g., more than one bit). Such cells can be referred to as multi-state memory cells, multi-digit cells, or multi-level cells (MLCs). In certain examples, MLC has been referred to as a memory cell that can store two bits of data per cell (e.g., one of four programmed states). MLC is used herein in its broader context, to refer to any memory cell(s) that can store more than one bit of data per cell (i.e., that can represent more than two programmed states). Herein, a memory cell that can store two bits of data per cell (e.g., one of four programmed states) can be referred to as a duo-level cell (DLC). A triple-level cell (TLC) can refer to a memory cell that can store three bits of data per cell (e.g., one of eight programmed states). A quad-level cell (QLC) can store four bits of data per cell, and a penta-level cell (PLC) can store 5 bits of data per cell.

In a memory device, such as an individual NAND memory die, there are a number of configuration parameters, which are referred to as trims or trim information, stored in memory of the individual NAND memory device. When the NAND memory device powers up, a significant number of the configuration parameters are pulled from the memory into appropriate locations in the NAND memory device, or components of the NAND memory device are set to operate according to operational values of the configuration parameters. The retrieval of these configuration parameters is performed before the NAND memory device can be operated in the application in which it is placed. The pulling and setting of configuration parameters upon power up can be referred to as initializing or an initialization.

The configuration parameters can include a large number of items such as specific voltages within the NAND memory device, timings for operation of the functions of the NAND memory device, or behaviors of the NAND memory device, where such configuration parameters are customizable. This customization allows a manufacturer to use a flexible design to build a somewhat generic design such that debug and tuning can be performed with the setting of the configuration parameters for a particular user application. Each memory die can contain thousands of stored configuration parameters that are initialized in an initialization routine before the NAND memory device can be used.

As a NAND memory device is brought through a development phase by a manufacturer, the configuration parameters can change such that thousands of configuration parameters can change. There can be process variation of the microchips with respect to process voltage and temperature. As a result, one discrete NAND die may not behave the same as another die. The use of the configuration parameters that are loaded during the initialization of the NAND memory device allows for compensation such that the manufacturer can effectively make every NAND memory device operate as close to the same as possible. It is important to provide measures aimed at optimizing or enhancing initialization of a NAND memory device.

The configuration parameters can be stored in a normal memory unit inside of the NAND memory device, where a normal memory unit is a unit that stores user data. A certain amount of data storage space of the NAND memory device can be dedicated to hold trim information, where integrity of that trim information is important. With a NAND memory device arranged as a memory array having a number of blocks of memory cells, the amount of storage space dedicated to hold trim information can be a block of the NAND memory array. This dedicated block can be referred to as the initialization block of the memory die. Since user devices do not access this dedicated block, it can also be referred to as the ROM block of the memory die. In some instances, the dedicated amount of storage space can be multiple blocks of memory cells. Alternatively, the dedicated amount of storage space of a memory die can be a storage space separate from the storage space of the memory array of the memory die.

NAND memory devices are used in many different user applications with different usage models and different operating conditions. The NAND memory device is able to load all of the initialization settings for a myriad of different scenarios ranging from a car's information system in a hot environment, for example, a location having a 120 degrees outside temperature to an application that is at room temperature or cooled. In addition, there are applications like mobile phones that power on and power off to save battery power. If the NAND memory device powers up with a voltage setting that is read incorrectly, this error may compromise or completely bring down the whole NAND memory device such that it may not be able to work for the intended user device. Therefore, it is important that configuration parameters that are pulled in during an initialization are as safe as possible. The chip initialization in which the configuration parameters are applied from memory of the NAND chip is to be robust and be able to operate reliably over and over again.

There are a number of ways that information can be read from a storage media, whether it is NAND, SRAM, DRAM, or other storage media. Shielded bit line (SBL) sensing and all bit line (ABL) sensing are two sensing configurations for reading (sensing) operations of a NAND memory device. Data lines (BLs), which can be implemented as bit lines, in the NAND memory device line run in parallel along a large distance of the NAND memory die and can be considered to be arranged as even data lines and odd data lines, with an even data line between two odd data lines and an odd data line between two even data lines.

FIG. 1A illustrates an embodiment of an example arrangement of data lines with respect to sense amplifiers in an SBL sensing configuration. In SBL sensing, even BLs are sensed with odd BLs grounded or connected to a "shield" stable voltage; and odd BLs are sensed with even BLs grounded or connected to a "shield" stable voltage. The grounded BL acts as a shield to protect against noise from other BLs due to capacitive coupling. For example, an even BL 106-1 is coupled to a sense amplifier 110-1 and is sensed with a NAND string 115-1 of memory cells electrically coupled to the even BL 106-1 and with an odd BL 107-1 grounded or connected to a "shield" stable voltage. An even BL 106-2 is coupled to sense amplifier 110-2 and is sensed with a NAND string 115-3 of memory cells electrically coupled to the even BL 106-2 and with odd BL 107-2 and odd BL 107-1 grounded or connected to a "shield" stable voltage. The arrangement of an odd BL between a pair of even BLs acts as a shield in the sensing of such even BLs. The odd BL 107-1 can be coupled to the sense amplifier 110-1 and sensed with a NAND string 115-2 of memory cells electrically coupled to the odd BL 107-1 and with the even BL 106-1 grounded or connected to a "shield" stable voltage. The odd BL 107-1 can be coupled to the sense amplifier 110-1 by a switch 108-1. The switch 108-1 can be implemented as one of a number of switching mechanisms that allows selection of one BL over another BL with the non-selected BL coupled to ground or to a "shield" stable voltage. The odd BL 107-2 can be coupled to the sense amplifier 110-2 and sensed with a NAND string 115-4 of memory cells electrically coupled to the odd BL 107-2 and with the even BL 106-2 grounded or connected to a "shield" stable voltage. The odd BL 107-2 can be coupled to the sense amplifier 110-2 by a switch 108-2. The switch 108-2 can be implemented as one of a number of switching mechanisms that allows select of one BL over another BL with the non-selected BL coupled to ground or to a "shield" stable voltage.

Typically, SBL sensing utilizes a voltage style sensing having two primary phases. One phase is a pre-charge phase in which BLs are charged while the NAND strings are disconnected (BL floated). The second phase is a sense phase in which the NAND strings are connected, and the sense amplifier detects a voltage differential between erased and programmed NAND strings. Noise from sensed BLs is mitigated by grounded BLs in between sensed BLs acting as shields. In FIG. 1A, the even BLs are sensed and the odd BLs are grounded. Following the reading of the even BLs, the odd BLs are sensed with the even BLs grounded. The sense amplifiers can be coupled to BLs in a one-to-two configuration of sense amplifier to data lines.

Figure 1B:
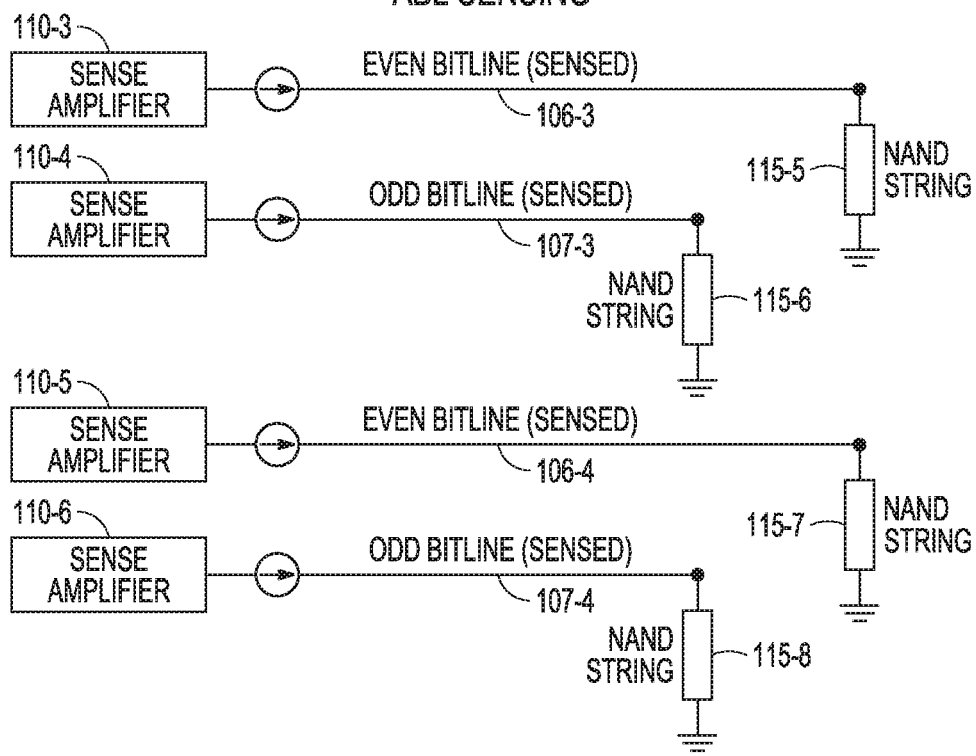
FIG. 1B illustrates an example arrangement of data lines with respect to sense amplifiers in an all bit line sensing configuration, according to various embodiments.

FIG. 1B illustrates an embodiment of an example arrangement of data lines with respect to sense amplifiers in an ABL sensing configuration. In ABL sensing, BLs are sensed simultaneously. The BLs in an ABL architecture can be considered even and odd BLs sensed simultaneously such as even BLs 106-3 and 106-4 and odd BLs 107-3 and 107-4. For example, the even BL 106-3 is coupled to a sense amplifier 110-3 and is sensed with a NAND string 115-5 of memory cells electrically coupled to the even BL 106-3. The odd BL 107-3 can be coupled to the sense amplifier 110-4 and sensed with a NAND string 115-6 of memory cells electrically coupled to the odd BL 107-3. The even BL 106-4 is coupled to sense amplifier 110-5 and is sensed with a NAND string 115-7 of memory cells electrically coupled to the even BL 106-4. The odd BL 107-4 can be coupled to the sense amplifier 110-6 and sensed with a NAND string 115-8 of memory cells electrically coupled to the odd BL 107-4. ABL sensing utilizes current style sensing. ABL sensing uses a number of techniques to mitigate noise from adjacent BLs and is sensitive to timing accuracy. The sense amplifiers are coupled to BLs in a one-to-one configuration of sense amplifier to data line. ABL sensing effectively uses twice the number of sense amplifiers compared to SBL sensing.

SBL sensing on die is historically the most robust form of reading, which does not use trimmed by die (TBD) trims to work reliably. SBL is ideal for reading an initialization block at powerup using a static set of defaults that are the same for all dies. The static set of defaults are stored settings in read only memory portions of the memory die, which can take a number of different forms. Basic reading in a SBL architecture is performed in two voltage sensing stages, for example reading even BLs and then reading odd BLs. When reading even BLs, the odd BLs are the shield BLs to prevent coupling across the even BLs during a sensing phase (BL-BL coupling immunity). To read the odd BLs, the even BLs are at a shield stable voltage.

Figure 2:
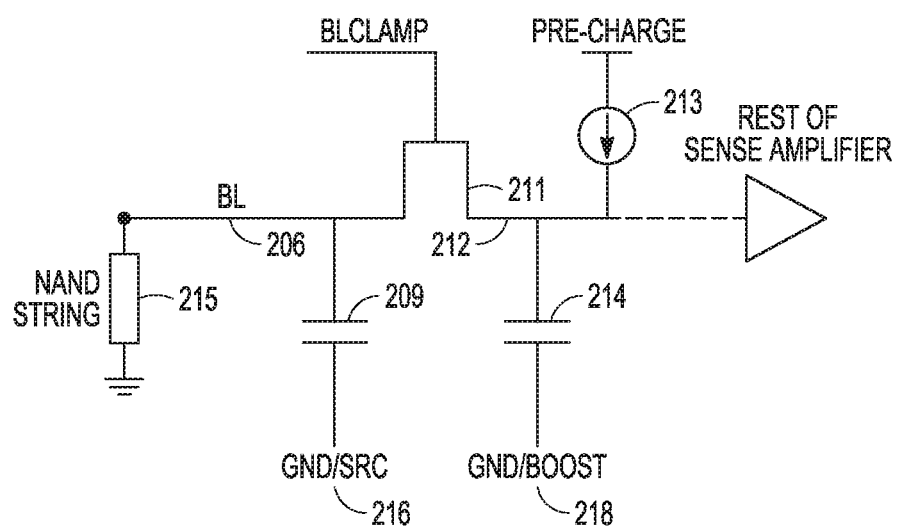
FIG. 2 illustrates an arrangement of a data line with a string of a NAND memory die with respect to an entry to a sense amplifier, according to various embodiments.

FIG. 2 illustrates an arrangement of a data line. An example configurations can include BL 206 with a NAND string 215 of a NAND memory die and with a temporary data cache (TDC) 212 situated as an entry to a sense amplifier. The BL 206 has an associated capacitance 209 coupling the BL 206 to a source (SRC) 216, such as a source plate, which can be grounded. The TDC 212 can operate with additional data caches to allow for memory cells of the NAND memory device to operate as MLCs. The TDC 212 basically connects the rest of the sense amplifier to the data line BL 206 that is being sensed with the other data lines and NAND strings of the array of the memory device arranged in a similar manner. The TDC 212 can include a current source 213 to pre-charge the BL 206 and a capacitance 214 coupled to ground or a boost source 218. The BL 206 can be coupled to the TDC 212 by a data line clamp such as blclamp 211. In the sensing phase, the BLs being sensed have all been pre-charged up to a voltage, while the shield BLs are tied to a source such as SRC 216.

Figure 3:
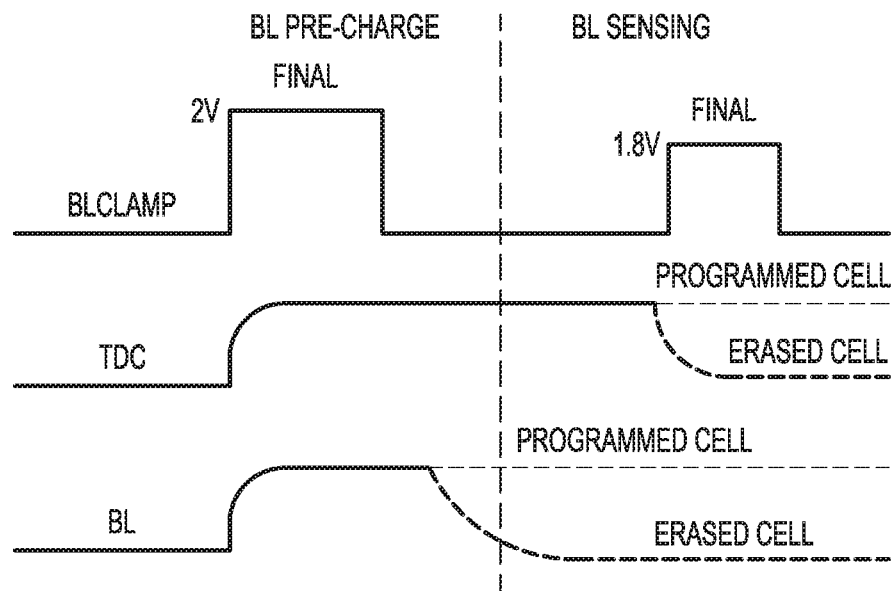
FIG. 3 illustrates a typical shielded bit line sensing operation with an applied signal and voltage responses at components of the structure of FIG. 2, according to various embodiments.

FIG. 3 shows a typical SBL sensing operation with the BL 206 operated as an even BL or an odd BL with a signal applied to the blclamp 211 and voltage level response at the TDC 212 and the BL 206 of FIG. 2. In the pre-charge phase before performing the sensing phase, the BL 206 being pre-charged, associated with the NAND string 215, is floated, that is, the BL 206 is electrically disconnected with respect to its associated NAND string 215 such that the NAND string 215 is not connected during the pre-charge phase. The pre-charge path of the current source 213 is turned on. In this example, the signal applied to the blclamp 211 has an initial pulse of 2V and the voltage of the TDC 212 and the BL 206 raises to a steady level to pre-charge the BL 206. The blclamp voltage can be modulated to establish the sensing threshold between erased and programmed cells.

Once the pre-charge phase is complete, the NAND string 215 is enabled between the pre-charge and sensing phases, the BLs can be then left floating, and the pre-charge path of the current source 213 is turned off. The sensing phase can be executed in which the pulse on the clamp 211 can be at 1.8 V in this example. If a selected memory of the NAND string 215 is erased, the BL 206 discharges through the NAND string 215 to the SRC 216, with the enablement of the NAND string 215, and erased data, which can be assigned to a '1,' is sensed. The capacitance 214 of the TD 212 also discharges to the SRC 216. Programmed cells, for which string current is not present and not able to discharge the capacitance of the BL 206, maintain the BL charged resulting in programmed data, which can be assigned to a '0.' The capacitance of the BL is the parasitic capacitance of the BL in the structure.

In the SBL approach, data from one data line to a next similar data line is protected because of a shield in between these two data lines. Whether a one or a zero is being sensed on the sense amplifier associated with the data line, there is not a significant amount of cross-talk due to the shielding arrangement. The SBL approach basically includes the data lines that are being sensed being charged up, followed by a wait time, and after the wait time, NAND strings associated with these data lines are enabled to electrically couple the NAND strings to their associated data lines. Strings with erased cells discharge their associated data lines, while associated strings having programmed cells remain at a higher voltage level than the discharged data lines. The sensing function is based on the differential voltage between these two voltages associated with a programmed cell and an erased cell. Without any cross-talk between data lines arranged running parallel to each other with alternate lines providing shielding during sensing, the SBL sensing can be an appropriate methodology for initialization, though SBL sensing is technically slower for performance than ABL sensing, because only half of the data (even or odd data line) is read at any given time.

Figure 4:
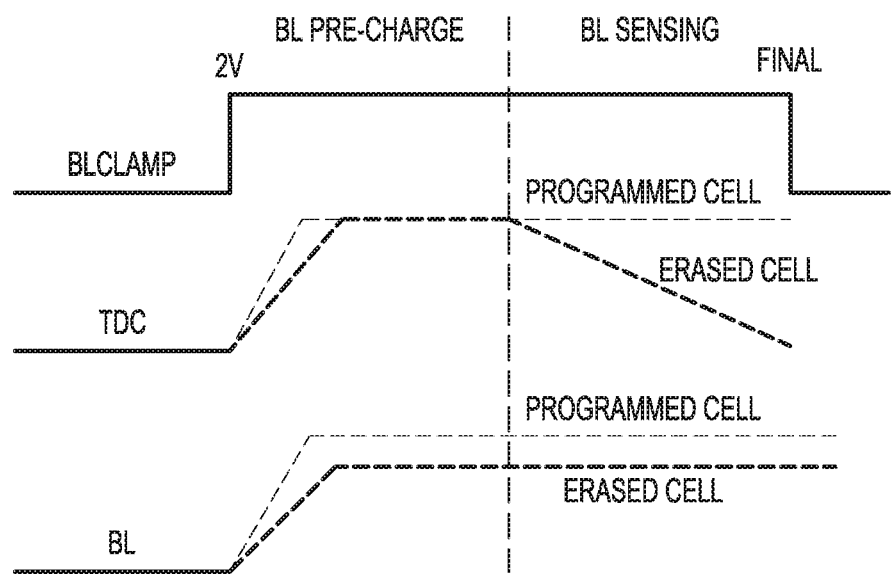
FIG. 4 illustrates a typical all bit line sensing operation with an applied signal and voltage responses at components of the structure of FIG. 2, according to various embodiments.

FIG. 4 shows a typical ABL sensing operation with the BL 206 of FIG. 2 operated simultaneously with adjacent data lines with a signal applied to the blcamp 211 and voltage level response at the TDC 212 and the BL 206 of FIG. 2. In the pre-charge phase before performing the sensing phase, the BL 206 being pre-charged, associated with the NAND string 215, is not floated, that is, it is electrically coupled with respect to its associated NAND string 215, that is, the NAND string 215 is connected during the pre-charge phase. The pre-charge current of the current source 213 is modulated downward between the pre-charge and sensing phases with the voltage to the blclamp 211 remaining constant. In this example, the signal applied to the blcamp 211 has an initial pulse and final pulse of 2V. The voltage of the TDC 212 and the BL 206 raises to a steady level, with the steady level of the BL 206 depending on whether a selected cell of the NAND string 215 is a programmed cell or an erased cell. At the start of the sensing phase, the pre-charge current is reduced, where the NAND string 215 is enabled during the entire read operation for both pre-charge phase and sensing phase. The BL 206 along with the other BLs being sensed is stable during the sense phase such that the ABL sensing operation is conducted without using shielding as in the SBL sensing operation. The sensing of each of a programmed cell and an erased cell utilizes current style sensing.

Figure 5:
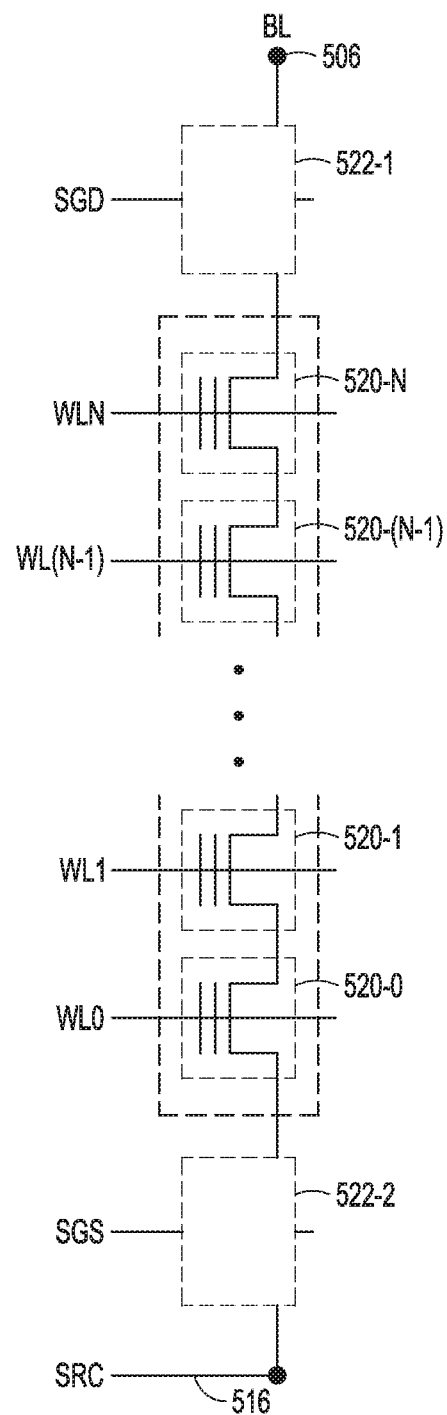
FIG. 5 is a representation of an example NAND string coupled to a data line, according to various embodiments.

FIG. 5 is a representation of an embodiment of an example NAND string 515 coupled to a data line BL 506. The NAND string 515 has memory cells 520-0, 520-1, . . . , 520-(N−1), and 520-N coupled to access lines WL0, WL1, . . . , WL(N−1), and WLN, respectively. The memory cells arranged serially are coupled to the BL 506 by a selector device 522-1 in series between the series arrangement of memory cells and the BL 506. The selector device 522-1 can be a select gate transistor on a drain-side of the NAND string 515, with the selector device 522-1 coupled to a select line SGD. Such a select gate transistor can be structured as multiple select gate transistors in series. With the selector device 522-1 enabled, the selector device 522-1 is turned to an on-state providing a conductive path between BL 506 and the entry to the string of serially memory cells. The memory cells arranged serially are coupled to a source line SRC 516 by a selector device 522-2 in series between the series arrangement of memory cells and the SRC 516. The selector device 522-2 can be a select gate transistor on a source side of the NAND string 515, with the selector device 522-2 coupled to a select line SGS. Such a select gate transistor can be structured as multiple select gate transistors in series. With the selector device 522-2 enabled, the selector device 522-2 is turned to an on-state providing a conductive path between the bottom of the string of serially memory cells and SRC 516. With the selector device 522-1 and 522-2 enabled and a memory cell of the memory cells 520-0, 520-1, . . . , 520-(N−1), and 520-N in an erased state, there is a conductive path from BL 506 to SRC 516. Under the normal classic SBL sensing operation, the selectors device 522-2 are in an off-state during pre-charge. Under the normal classic SBL sensing operation, the selector device 522-2 is in an off-state during pre-charge. The NAND string 515 can be structured as one of multiple vertical strings in a 3D memory array of a memory device. Such 3D NAND strings can be implemented in a memory device using SBL sensing and a memory device using ABL sensing.

Due to the importance of initialization when a NAND memory device is powered up, SBL sensing has typically been used in a number of memory devices, as the shielding of the read operations provides mitigation of noise between data lines being sensed. However, as NAND memory devices have moved to higher densities by using 3D memory array structures, architectural issues can make SBL sensing less attractive. With the migration from 2D NAND memory devices to 3D NAND memory devices, issues can arise with respect to data line contacts coupling the data line to a string of memory cells. The data lines can basically be viewed as data lines that traverse relatively long distances across the NAND memory die, where the shielded data line structure is directed to address or avoid capacitance between the data lines. In the 3D arrangement, an additional concern arises with data line contacts coupling the NAND string and the data line. The data line contacts are next to each other in upper level metals of the memory array structure, which results in capacitive coupling. If the data line contacts are not laid out efficiently, the resultant NAND die size may be large, increasing the expensive to manufacture.

Figure 6B:
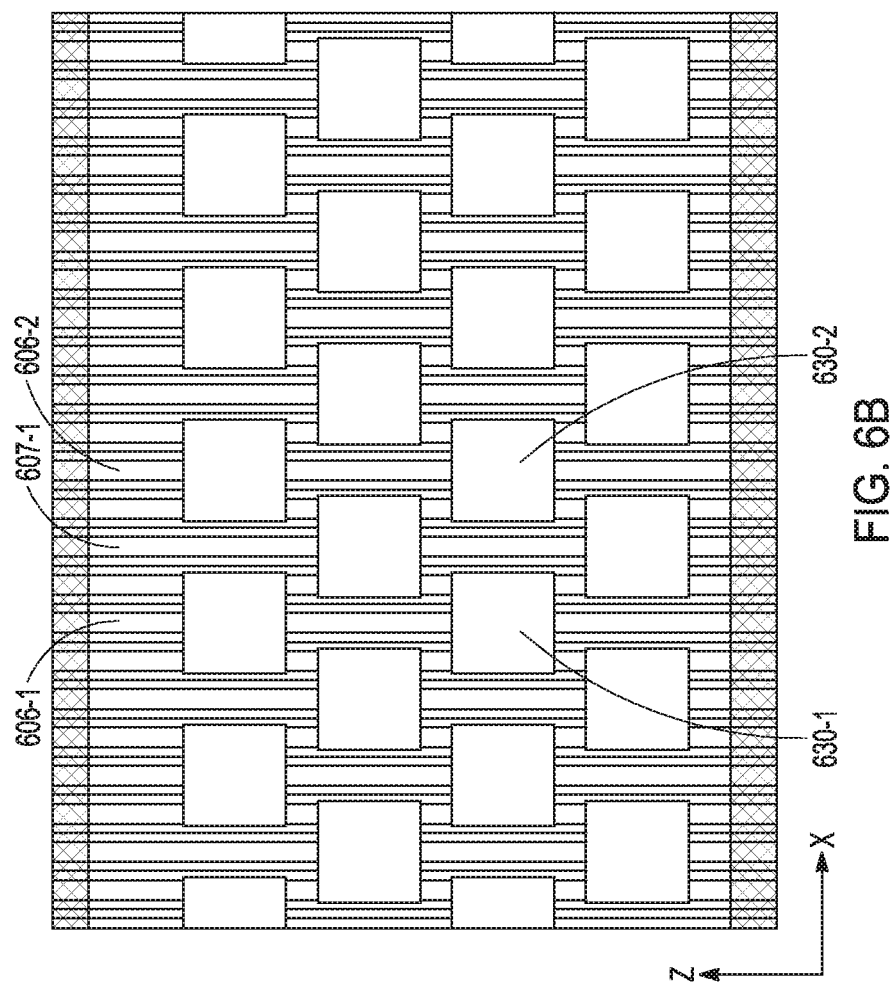
FIG. 6B illustrates a top view of the example three-dimensional memory structure of FIG. 6A, according to various embodiments.
Figure 6A:
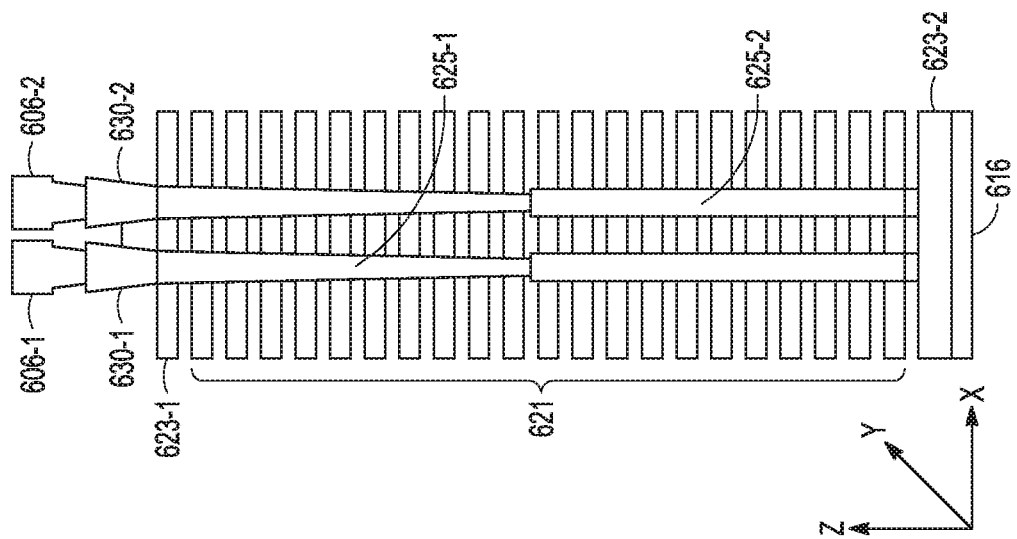
FIG. 6A illustrates a cross-section of an example three-dimensional memory structure showing two data lines coupled to pillars by data line contacts, according to various embodiments.

FIG. 6A illustrates a cross-section of an embodiment of an example 3D memory structure in which two data lines 606-1 and 606-2 of a 3D memory device are coupled to pillars 625-1 and 625-2, respectively, by data line contacts 630-1 and 630-2. The 3D memory device has more that two data lines and two pillars, though not shown. Memory cells are structured along pillars 625-1 and 625-2 with each memory cell coupled to an access line of a set of access lines 621 between select lines 623-1 and 623-2 with select line 623-2 above a source line 616. The elements shown in FIG. 6A are not shown to scale, as the data line contacts 630-1 and 630-2 are significantly larger than the two data lines 606-1 and 630-2 in a cross-section above the pillars 625-1 and 625-2. The two data lines 606-1 and 606-2 run along the memory die in the Y direction. There can be significant capacitive coupling between the relatively large data line contacts 630-1 and 630-2.

FIG. 6B illustrates a top view of the example 3D memory structure of FIG. 6A. This top view shows the large data line contacts 630-1 and 630-2 relative to the even data lines 606-1 and 606-2. An odd data line 607-1 provides a shield between the even data lines 606-1 and 606-2 to mitigate capacitive coupling between the even data lines 606-1 and 606-2. However, the layout of the data line contacts for the data lines results in the data line contacts 630-1 and 630-2 being close together, with capacitive coupling between data line contacts 630-1 and 630-2.

Figure 6C:
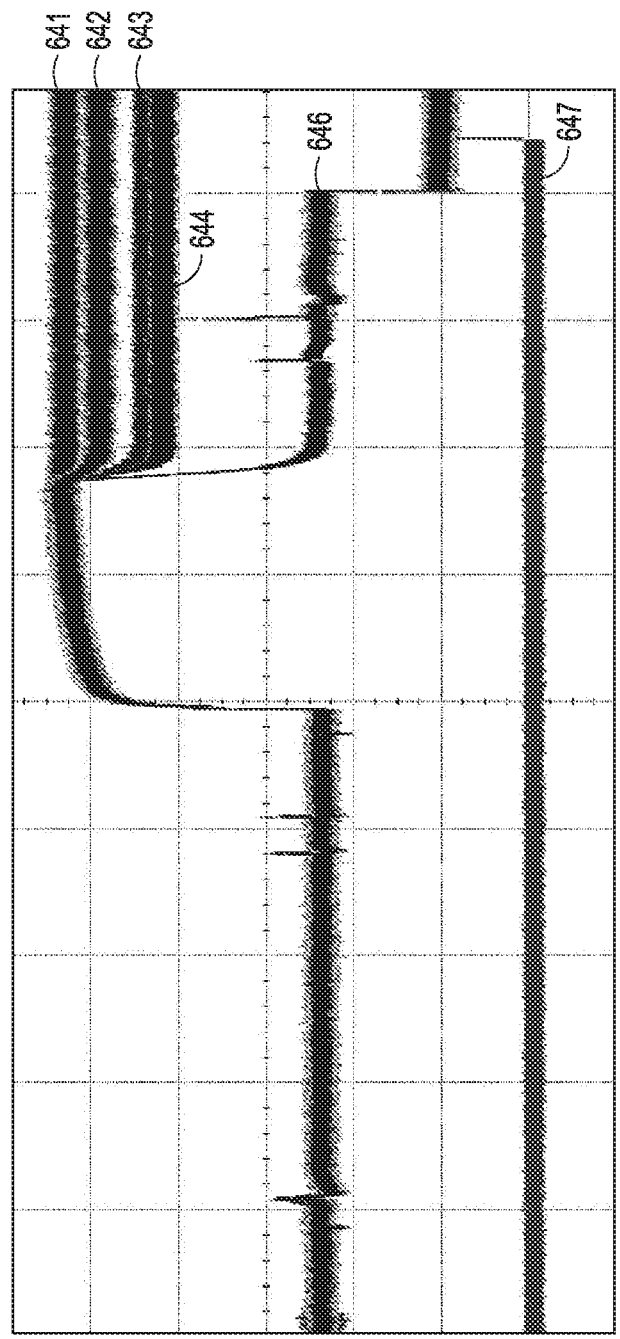
FIG. 6C illustrates a degradation due to pattern dependent coupling with respect to an example 3D memory structure, according to various embodiments.

FIG. 6C illustrates a degradation due to pattern dependent coupling with respect to an example 3D memory structure. Measurement signal 641 is for a pattern of solid 0s, 0 data, for a given data line in which all the data lines around the given data line have the same data. Measurement signals 641, 642, 643, and 644 are for pattern of 0s for a given data line in which different numbers of the data lines around the given data line have same the data. Measurement signal 646 is for a pattern of solid 1s, 1 data, for a given data line in which all the data lines around the given data line have the same data. Signal 647 is a reference line. The variations of measurement signals 642, 643, and 644 from measurement signal 641, with respect to measurement signal 646, shows a degradation of the sensing margin. Since the shield data lines should prevent such a degradation from happening, it is apparent that the capacitive coupling from the data line contacts is a source of the degradation. As illustrated in FIGS. 6A and 6B, even if an even data line is shielded by odd data lines during a SBL read operation, the data line contacts between even pillars are not shielded.

Figure 7:
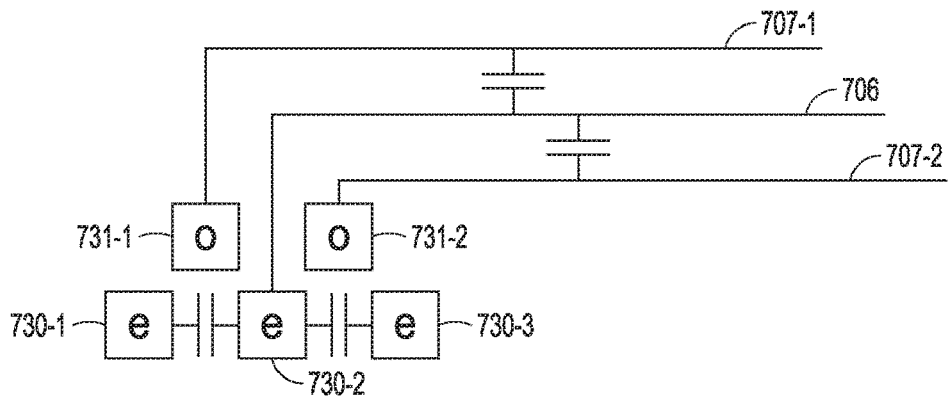
FIG. 7 shows a representation of example data line contacts and data lines, similar to the discussions of FIGS. 6A-C, that indicates that data line contacts are significantly larger in a localized surface area than data lines, according to various embodiments.

FIG. 7 shows a representation of example data line contacts and data lines, similar to the discussions of FIGS. 6A-C, that indicates that data line contacts are significantly larger in localized surface area than data lines, that is, without considering the length of the data lines. Odd data lines 707-1 and 707-2 are coupled to odd data line contacts 731-1 and 731-2, respectively. Even data line 706 is situated between the odd data lines 707-1 and 707-2, which capacitively couples the even data line 706 to the odd data lines 707-1 and 707-2. The even data line 706 is coupled to even data line contact 730-2. With the relatively large surface of data line contacts compared to data lines, the arrangement of data line contacts can be precluded from an arrangement of even data line contacts being shielded by odd data line contacts. The even data line contact 730-2 is capacitively coupled to even data line contact 730-1 and even data line contact 730-3. Though odd data lines 707-1 and 707-2 shield even data line 706 from other even data lines when reading even data line 706 by the layout of the data lines, even data contact 730-2, corresponding to the even data line 706, is not shielded by an arrangement of the odd data line contacts 731-1 and 731-2 and even data line contacts 730-1 and 730-3. The data line contact to data line contact coupling can lead to possible chip initialization failures. Though SBL sensing can maintain even and odd bit line shielding, even and odd data line contact shielding is not provided.

In various embodiments, an element of an ABL sensing operation is implemented in a modified SBL sensing operation. Like ABL sensing, data lines are not floated during the pre-charge phase of the modified SBL sensing operation during NAND initialization. The combined approach of sensing using SBL sensing and ABL sensing married together mitigates risks inherent to SBL sensing and ABL sensing. While typical SBL sensing is sensitive to data line contact to data line contact coupling, ABL sensing is sensitive to timing and voltages that are not controlled prior to initialization. ABL relies on timing accuracy that usually can be achieved after a TDB activity. During initialization block read, also referred to as ROM block read, such accuracy is missing, since the TDB values are stored inside the initialization block itself, which is being mad. The read of the initialization process is performed using fixed defaults stored in the memory die to cover for process and temperature variations. This is prone to risk of initialization failure and yield loss in manufacturing.

Figure 8:
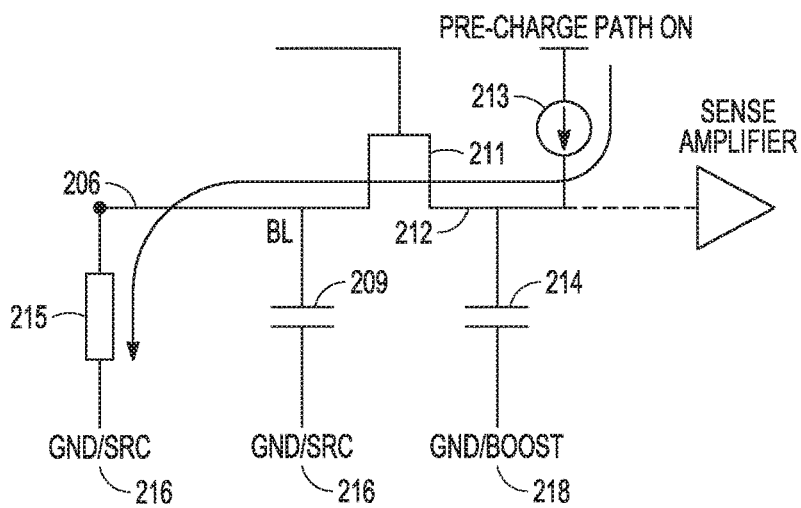
FIG. 8 illustrates an example pre-charge of the data line in the structure of FIG. 2 in a sensing procedure incorporating all bit line sensing into shielded bit line sensing, forming a modified shielded bit line sensing process, according to various embodiments.

FIG. 8 illustrates an embodiment of an example pre-charge of the data line 206 in the structure of FIG. 2 in a sensing procedure incorporating ABL sensing into SBL sensing, forming a modified SBL sensing process. Performance of pre-charging the BL 206 is accomplished with NAND string 215 enabled and not set to float in the modified SBL sensing. The non-float status can be implemented by enabling selector devices in the NAND string 215 to electrically couple series arranged memory cells of the NAND string 215 to the data line 206 and to the source 216 or ground. With the NAND string 215 enabled, there is a pre-charge path through the current source 213 to BL 206 and through NAND string 215. Data line contacts of the strings having an erased memory cell will not couple down and affect the data read for programmed cells. Selected data lines that are in an erased state will not be pre-charged since current, Ipre-charge, from current source 213 is less than current, Istring, of erased memory cells of NAND string 215. A single sense operation using a feature of ABL sensing incorporated with SBL sensing is less complicated to debug and maintain in production.

The modified SBL approach with a NAND string not held in a float condition during pre-charge allows the coupling of data line contacts to be addressed before the sensing phase of a read operation. The string of cells that have erased data provides control over the sense amplifier providing current, as the sense amplifier does not supply enough current to the erased cells of the NAND string 215. With the NAND string 215 enabled and a selected memory cell erased, the path to the source or ground 216 prevents the TDC 212 and BL 206 from charging up to a higher voltage associated with a programmed string. Noise associated with data line contacts is addressed before actually performing a sensing operation.

Figure 9:
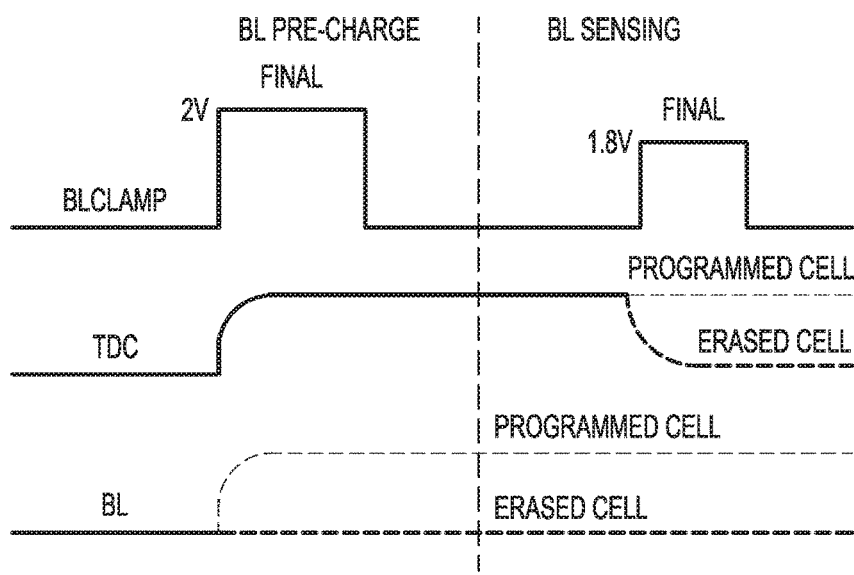
FIG. 9 illustrates a modified shielded bit line sensing operation with a data line and corresponding string in a non-float status with an applied signal and voltage responses at components of the structure of FIG. 8, according to various embodiments.

FIG. 9 illustrates a modified SBL sensing operation with the BL 206 and corresponding NAND string 215 in a non-float status with a signal applied to the blcamp 211 and voltage level response at the TDC 212 and the BL 206 of FIG. 8. In the pre-charge phase before performing the sensing phase, the pre-charge path of the current source 213 is turned on, and in this example, the signal applied to the blcamp 211 has an initial pulse of 2V. The voltage of the TDC 212 raises to a steady level. With the NAND string 215 enabled, the voltage of the BL 206 adjusts to a level corresponding to whether the selected memory cell of the NAND string 215 is a programmed cell or an erased cell. With Istring>>Ipre-charge for erased cells, the erased cells are not pre-charged. Once the pre-charge phase is complete, the NAND string 215 is maintained in an enabled state during the entire sensing operation. The sensing phase can be executed in which the pulse on the clamp 211 can be at 1.8 V, in this example, with the TDC 212 moving to the voltage of the NAND string 215 in which a voltage corresponding to a programmed cell is maintained or the voltage of the TDC 212 moves to the voltage corresponding to an erased cell. The BL 206 and its associated data line contact are stable during the sensing phase similar to the behaviour of an ABL sensing operation. The modified SBL sensing can be used in initialization or used in data operations of the memory die after the memory die has been initialized.

In initialization of a memory die, an ABL sensing operation has a drawback in that ABL sensing is sensitive to timing. Since timing is not highly controlled before the initialization process pulls in stored configuration settings, the initialization process can fail due to the inherent way that ABL sensing works. Use of ABL sensing in an initialization process can be implemented with a fall back hybrid initialization routine. The hybrid initialization routine can leverage the modified SBL scheme, taught herein, to prevent BL-BL coupling introducing the portion of ABL sensing that addressed the effects of data line contact to data line contact coupling. From a reliability stand point, this hybrid mode can prevent the noise and coupling mechanisms that can affect the accuracy of initialization block readout. In addition, a dedicated mad retry routine can be added to the hybrid initialization routine to remove an initialization failure mechanism implementing a hybrid sensing mode.

Figure 10:
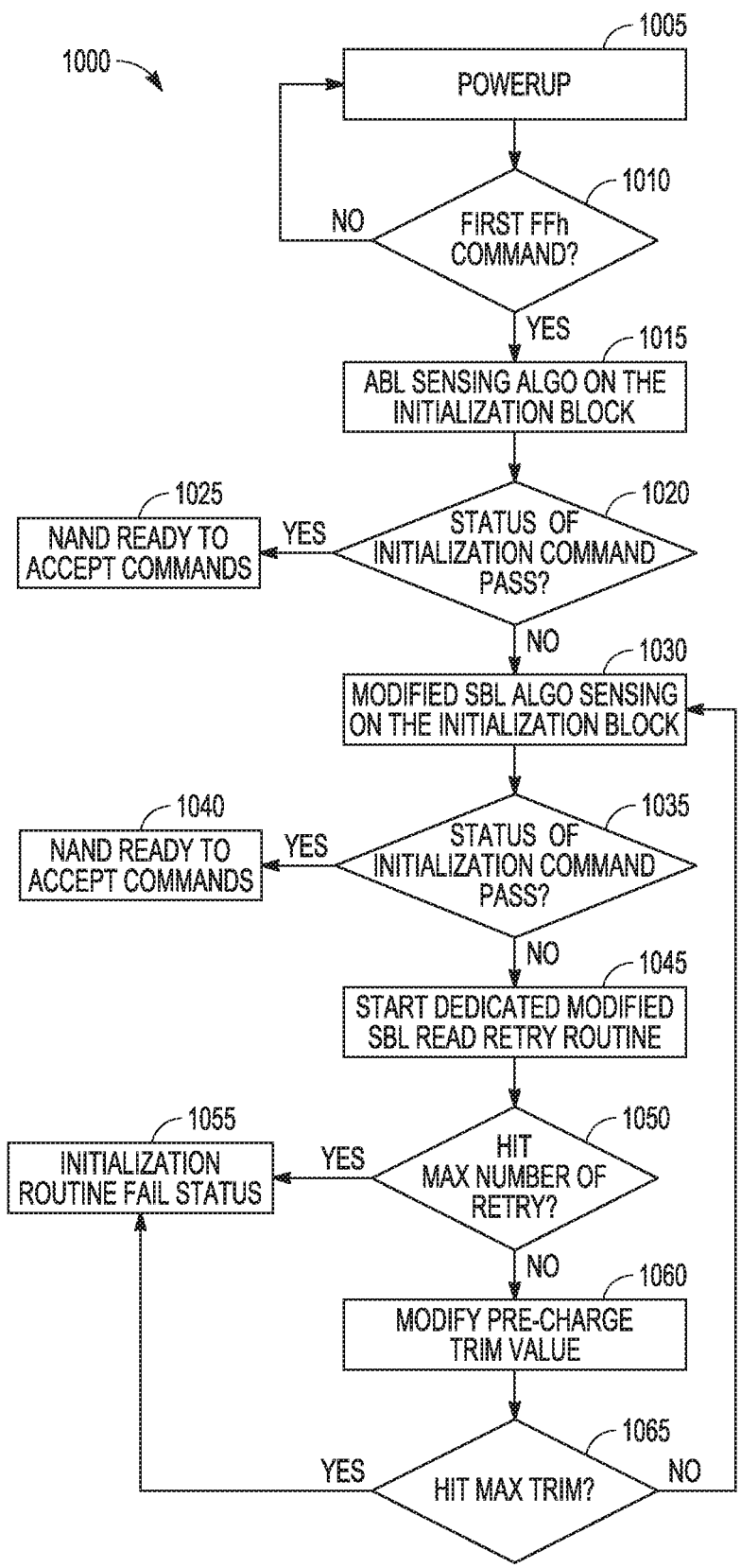
FIG. 10 is a flow diagram of an example hybrid initialization routine, according to various embodiments.

FIG. 10 is a flow diagram of an embodiment of an example hybrid initialization routine 1000. In example configurations, the hybrid initialization routine 1000, and other memory operations, will be performed at least in part by a memory controller of the memory die, such as the example discussed below as controller 1230 of memory die 1200. The hybrid initialization routine 1000 can provide data line contact to data line contact coupling mitigation, improved margin of the hybrid sensing, and a dedicated read retry routine. The flow of the hybrid initialization routine 1000 can include conducting a first attempt of a read of an initialization block using ABL sensing of the initialization block. In response to determining a failure in the ABL sensing, a modified SBL sensing operation can be triggered. The modified SBL sensing operation is a SBL sensing operation with the selected NAND strings in conduction mode during the pre-charge phase and the sense phase. A conduction mode of a NAND string is the NAND string enabled by enabling the selector devices of the NAND string into an on status. The hybrid initialization routine 1000 can include a dedicated modified SBL mad retry routine. The dedicated modified SBL read retry routine can overcome possible limitations associated with fixed default pre-charge current trim having insufficient margin by using a modified pre-charge current value after detecting a fail status after a reset command starts the initialization routine.

The hybrid initialization routine 1000 begins at power up, at 1005. At 1010, a determination is made as to whether the power up included a first FFH command. The FFH command is a standard reset command. A reset command can be used throughout the life cycle and usage of a NAND memory die, such as to interrupt a program operation, perform a read command, and reset the NAND memory die, or reset the NAND memory die if the state of the NAND memory die is uncertain. The determination of the FFH command as a first FFH command since the NAND memory die was powered up identifies that a fetch of configuration information and chip initialization is to begin in response to power up of the NAND memory die. Another command or event following power up can be used to begin the initialization procedure.

At 1015, an ABL sensing algorithm is applied to the initialization block. At 1020, a determination is made as to whether the initialization status was successful. A number of mechanisms can be used to determine if the reads of the initialization block were successful. Data and code, for initialization at power on, programmed initially in the initialization block during production of the memory die can be accompanied by programming bit-wise inverse of the data and code in another section of the initialization block. The determination of successful initialization at chip power up can include comparing data and code and the inverse of the data and code as direct alternates of each other. If the status of the initialization is determined to have passed verification, at 1025, the NAND memory die is designated as being ready to accept commands, including commands originating from external to the NAND memory die.

If the status of the initialization is determined to have not passed verification, at 1020, a modified SBL sensing algorithm is applied to the initialization block of the NAND memory die, at 1030. At 1035, in response to applying the modified SBL sensing algorithm, a determination is made as to whether the initialization status was successful. If the status of the initialization is determined to have passed verification, at 1040, the NAND memory die is designated as being ready to accept commands including commands originating from external to the NAND memory die. If the status of the initialization is determined to have not passed verification, at 1035, a dedicated modified SBL read retry routine is started, at 1045.

At 1050, a determination is made as to whether the number of retries has reached a maximum number of retries. In response to determining that the dedicated modified SBL read retry routine has been retried the maximum of retries, a fail status for the initialization routine is issued, at 1055. If the number of retries has not reached the maximum number of retries, a pre-charge trim value is modified, at 1060. At 1065, a determination is made as to whether a maximum trim value has been used. If the modified pre-charge trim value is determined to have used the maximum trim, a fail status for the initialization routine is issued, at 1055. If it is determined at 1065 that the modified pre-charge trim value used has not hit the maximum trim, the dedicated modified SBL read retry routine proceeds to applying the modified SBL sensing algorithm at 1030 and proceeds with the actions following the processing flow at 1030.

A memory controller of the memory die can include instructions to access the configuration information in the initialization block for the initialization. The configuration information can include settings that allow the memory controller of the memory die to operate sense amplifiers of the memory die to be coupled to BLs in a one-to-one configuration of sense amplifier to data lines for ABL sensing or to operate the sense amplifiers of the memory die to be coupled to BLs in a one-to-two configuration of sense amplifier to data lines for SBL sensing with a switching mechanism to switch between sensing even data lines and odd data lines. The configuration information can include settings that allow the memory controller of the memory die to switch between ABL sensing and modified SBL sensing in executing the hybrid initialization routine 1000. The hybrid initialization routine 1000 can be applied on a single memory die. For a structure having multiple memory dies in a stack, each memory die undergoes an initialization procedure, such as hybrid initialization routine 1000, upon power up to the individual memory die in the stack.

Figure 11A:
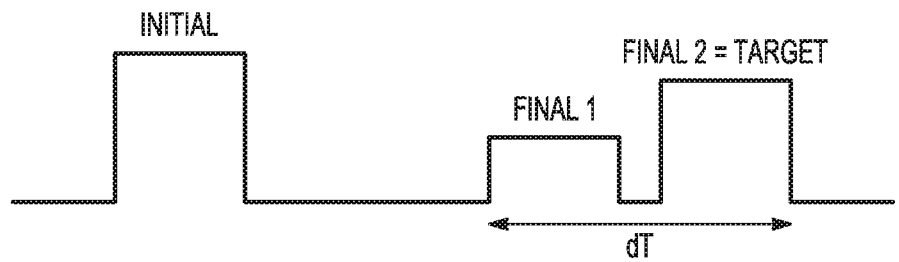
FIGS. 11A-11C illustrate example enhancements to improve hybrid initialization sensing, according to various embodiments.
Figure 11B:
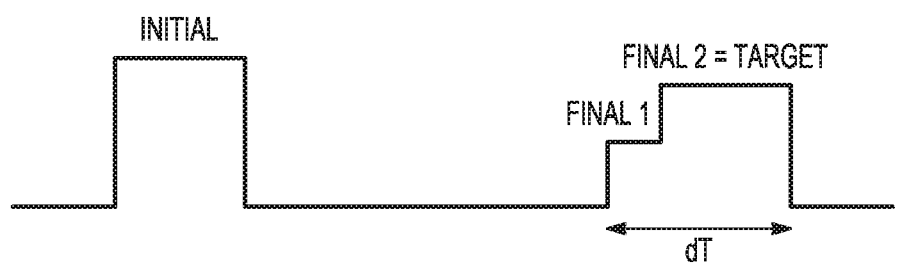
Figure 11C:
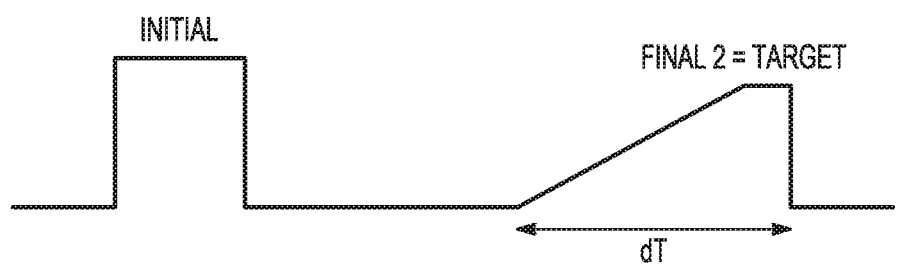

FIGS. 11A-11C illustrate embodiments of example enhancements to improve hybrid initialization sensing. These enhancements are directed to the waveform applied to the blclamp 211 of FIG. 2 that can address overshoot of the pulse in the sensing phase and bounce due to TDC 212 charge injection with respect to the source or ground 216. Hybrid SBL sensing noise can be mitigated by gradually excluding selected BLs that are not deep erased that can impact margin by introducing noise during the modified SBL read. FIG. 11A is a stepped approach applied to the blclamp 211 of FIG. 2 with an initial pulse applied in the pre-charge phase and two pulses applied during the sensing phase over a designated time, dT, with the second pulse, final2, stepped up in voltage level from the first pulse, final1.

The final2 pulse is the target for sensing with the final1 pulse returned to zero or a reference level before the application of the final2 pulse.

FIG. 11B is a multi-strobe approach applied to the blclamp 211 of FIG. 2 with an initial pulse applied in the pre-charge phase and a two section pulse applied over the dT in the sensing phase. The two section pulse includes a first constant level of voltage, shown as final1, and a second constant level, shown as final2, with the pulse raised to the constant level of final2, as the target level for sensing, above the constant level of final1 without first returning to zero or a reference level.

FIG. 11C is a ramped approach to a final target value. With an initial pulse applied in the pre-charge phase, the voltage applied to the blclamp 211 of FIG. 2, in the sensing phase, is ramped to the target voltage over the dT, where the target voltage is designated final2. Once final2 is reached, the voltage applied to the blclamp 211 is returned to zero or a reference level at the end of dT. The ramping can reach final2 before the end of the dT, where the final2 is then maintained constant until the end of the dT.

Figure 12:
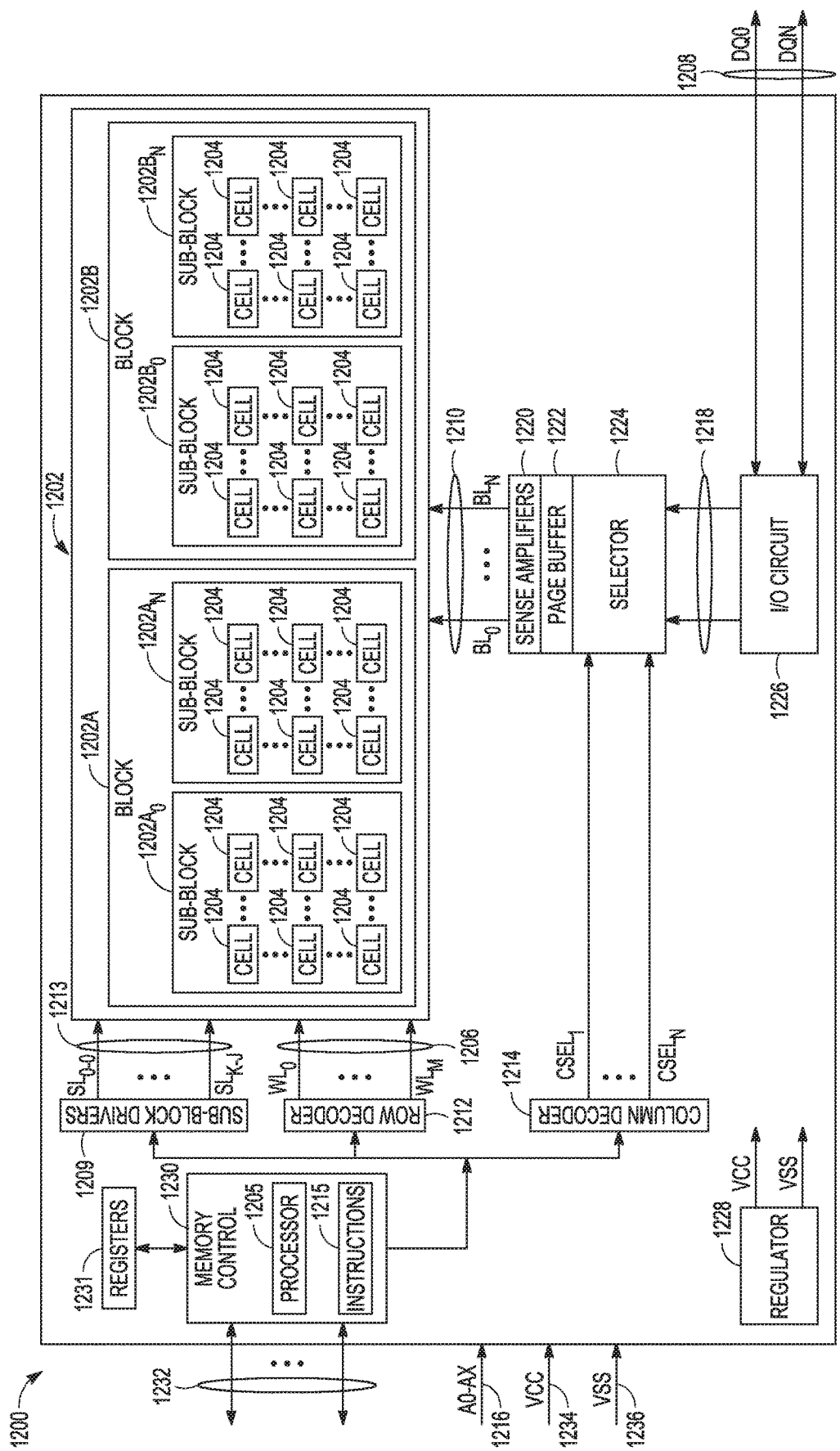
FIG. 12 illustrates a functional block diagram of an example memory device including a memory array having a plurality of memory cells, and one or more circuits or components operable to provide hybrid initialization of the example memory device and modified shielded bit line sensing with respect to memory cells of the memory array, according to various embodiments.

FIG. 12 illustrates a functional block diagram of an embodiment of an example memory device 1200 including a memory array 1202 having a plurality of memory cells 1204, and one or more circuits or components operable to provide hybrid initialization of the example memory device and modified SBL sensing with respect to memory cells of the memory array 1202. The memory device 1200 can be a memory die, for example, a NAND memory die. The memory array 1202 can be implemented with respect to odd and even data lines similar to the arrangements of FIGS. 1A-B. The memory device 1200 can include a row decoder 1212, a column decoder 1214, sub-block drivers 1209, sense amplifiers 1220, a page buffer 1222, a selector 1224, an input/output (I/O) circuit 1226, and a memory control 1230. The memory device 1200 can include registers 1231 that store operational parameters to execute various features of the memory device 1200, where the operational parameters can be updated using received status commands that adjust parameters for the memory device 1200. The registers 1231 or other such storage components can be included in the memory control 1230. The memory control 1230 can include processing circuitry, including one or more processors 1205, and can be configured to perform operations of the memory device 1200 by executing instructions 1215. The operations can include a hybrid initialization routine and a modified SBL sensing operation, as taught herein, with respect to but not limited to example embodiments associated with FIGS. 8-10, for example. Alternatively, the instructions 1215 can be located in the memory device external to the memory control 1230.

The memory cells 1204 of the memory array 1202 can be arranged in blocks, such as first and second blocks 1202A, 1202B. One or more of the blocks of the memory array 1202 can be dedicated as an initialization block of the memory device 1200. Each block can include sub-blocks. For example, the first block 1202A can include first and second sub-blocks 1202A$_0$, 1202A$_N$, and the second block 1202B can include first and second sub-blocks 1202B$_0$, 1202B$_N$. Each sub-block can include a number of physical pages, with each page including a number of memory cells 1204. Although illustrated herein as having two blocks, with each block having two sub-blocks, and each sub-block having a number of memory cells 1204, in other examples, the memory array 1202 can include more or fewer blocks, sub-blocks, memory cells, etc. In other examples, the memory cells 1204 can be arranged in a number of rows, columns, pages, sub-blocks, blocks, etc., and accessed using, for example, access lines 1206, first data lines 1210, or one or more select gates, source lines, etc.

The memory controller 1230 can control memory operations of the memory device 1200 according to one or more signals or instructions received on control lines 1232, including, for example, one or more clock signals or control signals that indicate a desired operation (e.g., write, read, erase, etc.), or address signals (A0-AX) received on one or more address lines 1216. One or more devices external to the memory device 1200 can control the values of the control signals on the control lines 1232 or the address signals on the address line 1216. In many example configurations, memory controller 1230 will be a controller on, or dedicated to, an individual memory die; and in many such examples will also control additional operations of the memory die. Such operations may be responsive to externally provided instructions; while others may be performed autonomously (for example, monitoring of operating conditions, read retry, load-balancing, garbage collection, etc.). In the depicted configuration, memory controller 1230 includes processing circuitry, including one or more processors 1205, which execute instructions to provide the functionalities described herein. In many examples, at least a portion of the instructions which may be executed by memory controller 1230 will be stored in memory within or accessible to memory controller 1230. For selected examples, in which some instructions are stored outside of memory controller 1230, for example in the main memory array 1202 of memory device 1200, instructions may be retrieved and temporarily stored within memory controller 1230 at the time of execution. Examples of devices external to the memory device 1200 can include, but are not limited to, a host, an external memory controller, a processor, or one or more circuits or components not illustrated in FIG. 12. In some example systems, some portion of the described memory controller functionality may be performed by either a host or an external memory controller, either also including processing circuitry including one or more processors to execute instructions to provide at least a portion of such functionality.

The memory device 1200 can use access lines 1206 and first data lines 1210 to transfer data to (e.g., write or erase) or from (e.g., read) one or more of the memory cells 1204. The row decoder 1212 and the column decoder 1214 can receive and decode the address signals (A0-AX) from the address line 1216, can determine which of the memory cells 1204 are to be accessed, and can provide signals to one or more of the access lines 1206 (e.g., one or more of a plurality of access lines (WL$_0$-WL$_M$)) or the first data lines 1210 (e.g., one or more of a plurality of data lines (BL0-BLN)), such as described above.

The memory device 1200 can include sense circuitry, such as the sense amplifiers 1220, configured to determine the values of data on (e.g., read), or to determine the values of data to be written to, the memory cells 1204 using the first data lines 1210. For example, in a selected string of memory cells 1204, one or more of the sense amplifiers 1220 can read a logic level in the selected memory cell 1204 in response to a read current flowing in the memory array 1202 through the selected string associated with the data lines 1210. The memory control 1230 can include instructions to access the configuration information in the initialization block of the memory device 1200 for the initialization of memory device 1200. The configuration information can include settings that allow the memory control 1230 to operate the sense amplifiers 1220 of the memory device 1200 to be coupled to data lines 1210 in a one-to-one configuration of sense amplifier to data line for ABL sensing or to operate the sense amplifiers 1220 of the memory device 1200 to be coupled to data lines 1210 in a one-to-two configuration of sense amplifier to data lines for SBL sensing with a switching mechanism to switch between sensing even data lines and odd data lines. The configuration information can include settings that allow the memory control 1230 to switch between ABL sensing and modified SBL sensing in executing a hybrid initialization routine, as taught herein.

One or more devices external to the memory device 1200 can communicate with the memory device 1200 using the I/O lines (DQ0-DQN) 1208, address lines 1216 (A0-AX), or control lines 1232. The I/O circuit 1226 can transfer values of data in or out of the memory device 1200, such as in or out of the page buffer 1222 or the memory array 1202, using the I/O lines 1208, according to, for example, the control lines 1232 and address lines 1216. The page buffer 1222 can store data received from the one or more devices external to the memory device 1200 before the data is programmed into relevant portions of the memory array 1202, or can store data read from the memory array 1202 before the data is transmitted to the one or more devices external to the memory device 1200.

The column decoder 1214 can receive and decode address signals (A0-AX) into one or more column select signals ($CSEL_1$-$CSEL_N$). The selector 1224 (e.g., a select circuit) can receive the column select signals ($CSEL_1$-$CSEL_N$) and select data in the page buffer 1222 representing values of data to be read from or to be programmed into memory cells 1204. Selected data can be transferred between the page buffer 1222 and the I/O circuit 1226 using second data lines 1218.

The memory control 1230 can receive positive and negative supply signals, such as a supply voltage (Vcc) 1234 and a negative supply (Vss) 1236 (e.g., a ground potential) with respect to Vcc, from an external source or supply (e.g., an internal or external battery, an AC-to-DC converter, etc.). In certain examples, the memory control 1230 can include a regulator 1228 to internally provide positive or negative supply signals.

To program or write data to a memory cell, a VPGM (e.g., one or more programming pulses, etc.) can be applied to selected access lines (e.g., $WL_i$), and thus, to a control gate of each memory cell coupled to the selected access lines. Programming pulses can begin, for example, at or near 15V, and, in certain examples, can increase in magnitude during each programming pulse application. While the program voltage is applied to the selected access lines, a potential, such as a ground potential (e.g., Vss), can be applied to the data lines and substrates (and thus the channels, between the sources and drains) of the memory cells targeted for programming, resulting in a charge transfer (e.g., direct injection or Fowler-Nordheim (FN) tunneling, etc.) from the channels to the floating gates of the targeted memory cells.

A Vpass can be applied to one or more access lines having memory cells that are not targeted for programming, or an inhibit voltage (e.g., Vcc) can be applied to data lines having memory cells that are not targeted for programming, for example, to inhibit charge from being transferred from the channels to the floating gates of such non-targeted memory cells. The pass voltage can be variable, depending, for example, on the proximity of the applied pass voltages to a access line targeted for programming. The inhibit voltage can include a supply voltage (Vcc), such as a voltage from an external source or supply (e.g., a battery, an AC-to-DC converter, etc.), relative to a ground potential (e.g., Vss).

As an example, if a programming voltage (e.g., 15V or more) is applied to a specific access line, such as WL4, a pass voltage of 10V can be applied to one or more other access lines, such as WL3, WL5, etc., to inhibit programming of non-targeted memory cells, or to retain the values stored on such memory cells not targeted for programming. As the distance between an applied program voltage and the non-targeted memory cells increases, the pass voltage required to refrain from programming the non-targeted memory cells can decrease. For example, where a programming voltage of 15V is applied to WL4, a pass voltage of 10V can be applied to WL3 and WL5, a pass voltage of 8V can be applied to WL2 and WL6, a pass voltage of 7V can be applied to WL1 and WL7, etc. In other examples, the pass voltages, or number of access lines, etc., can be higher or lower, or more or less.

Between applications of one or more programming pulses (e.g., VPGM), a verify operation can be performed to determine if a selected memory cell has reached its intended programmed state. If the selected memory cell has reached its intended programmed state, it can be inhibited from further programming. If the selected memory cell has not reached its intended programmed state, additional programming pulses can be applied. If the selected memory cell has not reached its intended programmed state after a particular number of programming pulses (e.g., a maximum number), the selected memory cell, or a string, block, or page associated with such selected memory cell, can be marked as defective.

To erase a memory cell or a group of memory cells (e.g., erasure is typically performed in blocks or sub-blocks), an erasure voltage (Vers) (e.g., typically VPGM) can be applied to the substrates (and thus the channels, between the sources and drains) of the memory cells targeted for erasure (e.g., using one or more data lines, select gates, etc.), while the access lines of the targeted memory cells are kept at a potential, such as a ground potential (e.g., Vss), resulting in a charge transfer (e.g., direct injection or FN tunneling, etc.) from the floating gates of the targeted memory cells to the channels.

When a host, which is a user device, sends an address to the memory device 1200, it typically can have an identification of a block, a page, and a column. The identification of the block is used to select the block of interest in the operation. The identification of a page is used to select the WL on which the page resides, and it also is used to select one particular sub-block as the WL is shared among the sub-blocks of the block. The sub-block on which the page resides is decoded and that sub-block is selected. The address provided by the user device is used to turn on and off the selector device and access memory cell. In typical operations, only one sub-block is selected such that SGDs of one sub-block are active.

Based on the address provided by the user device, the memory control 1230 can select any one sub-block or all sub-blocks. The memory control 1230 can generate the sub-block address to the sub-block drivers 1209 and select any one sub-block or all sub-blocks. The memory control 1230 can send the WL information to the row decoder 1212 and a column address to the column decoder 1214.

The sub-block drivers 1209 can include a number of independent drivers that generates signals to select lines $SL_{0-0} \ldots SL_{K-J}$. For an architecture in which each string includes a series of SGD0, SGD1 and SGD2 devices, each of the SGD0, SGD1 and SGD2 devices in each sub-block has its own driver such that they can be controlled individually, such that per each sub-block, there are three SGD drivers. For N sub-blocks having M SGDs, there are M*N individual drivers that can be addressed. For example, for four sub-blocks having three SGDs, the sub-block drivers 1209 can have 12 drivers that can be addressed. There is full flexibility on either turning on one SGD (SG0, SGD1, or SGD2) in one sub-block or all sub-blocks. Similarly, there is full flexibility to turn on all SGDs (SG0, SGD1, and SGD2) at the same time on one sub-block or all sub-blocks. Similarly, the sub-block drivers 1209 can include R*N drivers for R SGS devices in the N sub-blocks. Multiple input signals can be assigned to each individual driver, depending on the different voltages designed for operation of the respective driver during erase operations, program operations, and read operations. From the sub-block drivers 1209, appropriate operational signals can be sent to the memory array 1202 via the select lines ($SL_{(sub-block\ \#)-(SGD\ \#\ or\ SGS\ \#)}$) $SL_{0-0} \cdots SL_{K-J}$. In typical read and write operation, SGD0, SGD1, SGD2 devices in one sub-block can be driven together by one particular regulator, while the select gates in other sub-blocks are driven to another voltage such as ground (0V).

Figure 13:
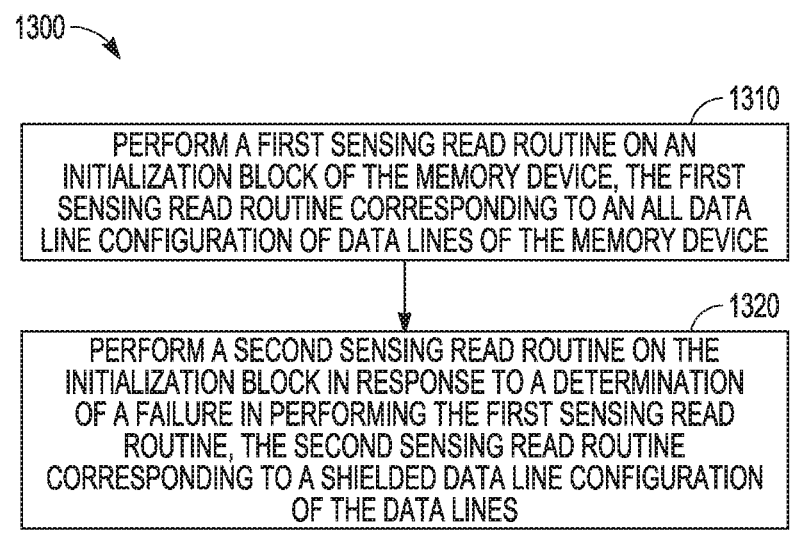
FIG. 13 is a flow diagram of features of an example method of operating a hybrid initialization routine of a memory device, according to various embodiments.

FIG. 13 is a flow diagram of features of an embodiment of an example method 1300 of operating a hybrid initialization routine of a memory device, such as memory device 1200. At 1310, a first sensing read routine is performed on an initialization block of the memory device, where the first sensing read routine corresponds to an all data line configuration of data lines of the memory device. The all data line configuration includes a data line corresponding to a string of the initialization block and adjacent data lines to the data line being sensed simultaneously.

At 1320, a second sensing read routine is performed on the initialization block in response to a determination of a failure in performing the first sensing read routine, where the second sensing read routine corresponds to a shielded data line configuration of the data lines. The shielded data line configuration includes a data line, corresponding to a string of the initialization block, being pre-charged and sensed with adjacent data lines to the data line being configured as shielding lines to the data line during the pre-charging and sensing. The string of the initialization block is enabled during the pre-charging of the data line. With the string enabled during pre-charging, the data line coupled to the string is in a non-floating voltage state. The string coupled to the data line can be maintained in an enabled status during a sensing phase directly following the pre-charging.

In response to a determination of a failure in performing the second sensing read routine, the second sensing read routine can be retried. A determination can be made that a number of retries of the second sensing read routine equals a maximum number of retries and a fail status routine can be initiated in response to the determination.

Variations of the method 1300 or methods similar to the method 1300 can include a number of different embodiments that may be combined depending on the application of such methods and/or the architecture of memory devices in which such methods are implemented. Such methods can include modifying one or more trim values of the memory device in response to a determination of successful completion of the second sensing read routine on the initialization block. Such methods can include modifying one or more trim values of the memory device after a number of retries of the second sensing read routine on the initialization block.

Such methods can include designating that the memory device is in condition to accept commands following a verification of a successful completion of the second sensing read routine that completes initialization of the memory device. The second sensing read routine can be performed in read operations of the memory device after completing initialization of the memory device.

In various embodiments, a memory device can comprise a memory controller and a memory array having multiple strings and multiple data lines, where each string includes multiple memory cells. The memory device can be implemented as a memory die. The memory device can be a 3D NAND memory device. The memory controller can include processing circuitry having one or more processors and can be configured to perform operations within the memory device. The operations can include pre-charging a first data line of the multiple data lines prior to reading a memory cell of a string of the multiple strings, the string selectively coupled to the first data line during the reading of the memory cell, with adjacent data lines to the first data line configured as shielding lines to the first data line during the pre-charging and reading of the memory cell. The operations can include coupling the string to the first data line such that the string is enabled during the pre-charging of the first data line. This enablement of the string places the data line, to which the string is coupled, into a non-floating voltage status. The string enabled during the pre-charging of the first data line can remain coupled to the first data line during a sensing phase of the first data line that follows the pre-charging. The pre-charging can be a pre-charge phase during an initialization of the memory device. The memory array can be a 3D memory array having an allocation of the memory array for initialization of the memory device.

Variations of such a memory device or similar memory devices can include a number of different embodiments that may be combined depending on the application of such memory devices and/or the architecture in which such memory devices are implemented. Such memory devices can include operations executed by the memory controller to include, during an initialization routine of the memory device, setting the memory device to operate with an architecture for the adjacent data lines to the first data line to operate as shielding lines to the first data line during pre-charging and sensing of the first data line. Variations can include operations executed by the memory controller to include a hybrid initialization routine on an initialization block of the memory device. The hybrid initialization routine can include a sensing read routine corresponding to an all data line configuration of data lines of the memory device, a modified sensing read routine corresponding to a shielded data line configuration of the data lines with selected strings enabled during the pre-charging, and a read retry routine associated with the modified sensing read routine. The modified sensing read routine can include performing pre-charge of a data line with a memory cell of the string enabled and the data line, coupled to the string, not floating.

In various embodiments, a memory device can comprise multiple data lines, multiple sense amplifiers coupled to the multiple data lines, a memory array, and a memory controller to execute functions associated with the memory array and other components of the memory device. The memory device can be implemented as a memory die. The memory device can be a 3D NAND memory device. The memory array can have multiple strings with each string including multiple memory cells and a SGD. The memory controller can include processing circuitry including one or more processors and can perform operations with respect to operation of the memory array and other components of the memory device. The operations can include activating the SGD of a string of the multiple strings to couple the string to a first data line of the multiple data lines such that the string is enabled during a pre-charging of the first data line. The operations include pre-charging the first data line, with the string enabled, prior to reading a memory cell of the string, with adjacent data lines to the first data line configured as shielding lines to the first data line during the pre-charging and reading of the memory cell.

Variations of such a memory device or similar memory devices can include a number of different embodiments that may be combined depending on the application of such memory devices and/or the architecture in which such memory devices are implemented. Such memory devices can include the memory controller executing operations that include, during an initialization of the memory device, setting the memory device to operate with an architecture for the adjacent data lines to the first data line to operate as shielding lines to the first data line. This architecture is a shielded data line configuration of data lines for the memory device. The setting of the memory device can be performed in response to performance of an initialization routine on an initialization block of the memory array.

Variations of such a memory device can include the memory controller of the memory device executing operations that include an initialization routine on an initialization block of the memory array, where the initialization block has multiple strings with each string having multiple memory cells. The initialization routine can include performance of a first sensing read routine on the initialization block with the first sensing read routine corresponding to an all data line configuration of the data lines. In an all data line configuration of the data lines of the memory device with respect to the initialization block, a data line corresponding to a string of the initialization block and adjacent data lines to the data line are sensed simultaneously. The initialization routine can include, in response to a determination of a failure in the performance of the first sensing read routine, performance of a second sensing read routine on the initialization block with the second sensing read routine corresponding to a shielded data line configuration of data lines. In the shielded data line configuration with respect to the initialization block, a data line, corresponding to a string of the initialization block, is pre-charged and sensed and adjacent data lines to the data line are configured as shielding lines to the data line during the pre-charging and sensing. In a modification of the shielded data line configuration, the string of the initialization block is enabled during a pre-charging of the data line. This enablement of the string during the pre-charging of the data line places the data line in a non-floating voltage status. The initialization routine can include a read retry routine associated with the second sensing read routine, with the read retry routine having a maximum number of retries.

In response to a successful initialization route, the operations executed by the memory controller can include selectively coupling sense amplifiers of the multiple sense amplifiers to data lines of the multiple data lines to operate in a one-to-one configuration of sense amplifier to data line or selectively coupling sense amplifiers to data lines of the multiple data lines to operate in a one-to-two configuration of sense amplifier to data lines.

Electronic devices, such as mobile electronic devices (e.g., smart phones, tablets, etc.), electronic devices for use in automotive applications (e.g., automotive sensors, control units, driver-assistance systems, passenger safety or comfort systems, etc.), and Internet-connected appliances or devices (e.g., Internet-of-Things (IoT) devices, etc.), have varying storage needs depending on, among other things, the type of electronic device, use environment, performance expectations, etc.

Electronic devices can be broken down into several main components: a processor (e.g., a central processing unit (CPU) or other main processor); memory (e.g., one or more volatile or non-volatile RAM memory device, such as DRAM, mobile or low power double-data-rate synchronous DRAM (DDR SDRAM), etc.); and a storage device (e.g., a NVM device, such as flash memory, ROM, a solid state drive (SSD), a managed memory device such as a MultiMediaCard (MMC) or a Universal Flash Storage (UFS) device, or other memory card structure or assembly, etc.). In certain examples, electronic devices can include a user interface (e.g., a display, touch screen, keyboard, one or more buttons, etc.), a graphics processing unit (GPU), a power management circuit, a baseband processor or one or more transceiver circuits, etc.

Figure 14:
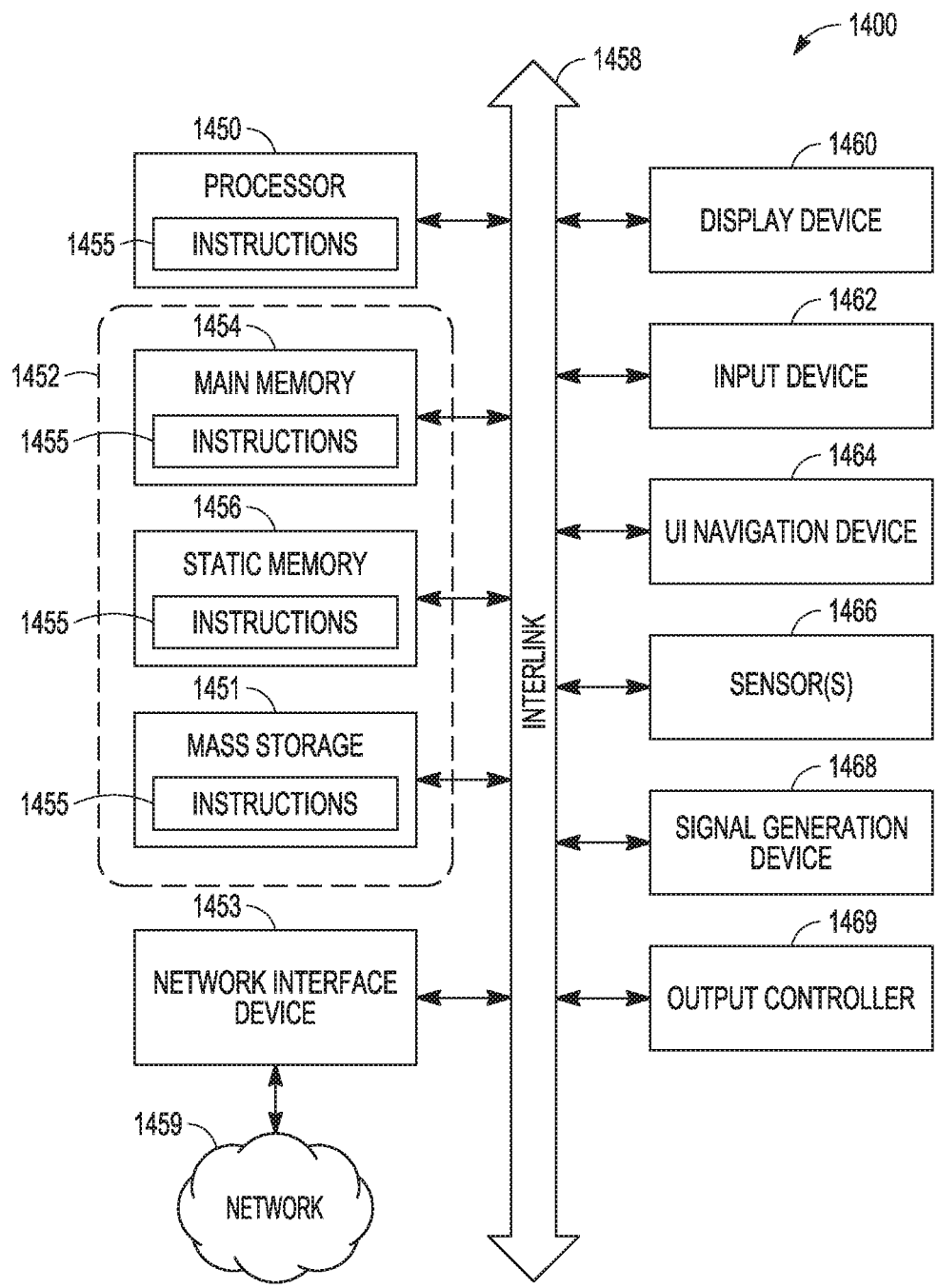
FIG. 14 illustrates a block diagram of an example machine having one or more memory devices structured to be operable to provide hybrid initialization of the respective memory device and modified shielded bit line sensing with respect to memory cells of such memory devices, according to various embodiments.

FIG. 14 illustrates a block diagram of an embodiment of an example machine 1400 having one or more memory devices structured to be operable to provide hybrid initialization of the respective memory device and modified shielded bit line sensing with respect to memory cells of the memory device. A memory controller of the memory device microcontroller, such as a microcontroller of the memory device, can execute operations that can include a hybrid initialization routine and a modified SBL sensing operation, as taught herein, with respect to but not limited to example embodiments associated with FIGS. 8-10. The machine 1400, having one or more such memory devices, may operate as a standalone machine or may be connected, for example networked, to other machines.

In a networked deployment, the machine 1400 may operate in the capacity of a server machine, a client machine, or both in server-client network environments. In an example, the machine 1400 may act as a peer machine in peer-to-peer (P2P) (or other distributed) network environment. The machine 1400 may be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations. The example machine 1400 can be arranged to operate with one or more memory devices to perform a hybrid initialization routine and a modified SBL sensing operation, as taught herein. The example machine 1400 can include one or more memory devices having structures as discussed with respect to the memory device 1200 of FIG. 12.

Examples, as described herein, may include, or may operate by, logic, components, devices, packages, or mechanisms. Circuitry is a collection (e.g., set) of circuits implemented in tangible entities that include hardware (e.g., simple circuits, gates, logic, etc.). Circuitry membership may be flexible over time and underlying hardware variability. Circuitries include members that may, alone or in combination, perform specific tasks when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer-readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable participating hardware (e.g., the execution units or a loading mechanism) to create members of the circuitry in hardware via the variable connections to carry out portions of the specific tasks when in operation. Accordingly, the computer-readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry, at a different time.

The machine (e.g., computer system) 1400 may include a hardware processor 1450 (e.g., a CPU, a GPU, a hardware processor core, or any combination thereof), a main memory 1454, and a static memory 1456, some or all of which may communicate with each other via an interlink (e.g., bus) 1458. The machine 1400 may further include a display device 1460, an alphanumeric input device 1462 (e.g., a keyboard), and a user interface (UI) navigation device 1464 (e.g., a mouse). In an example, the display device 1460, input device 1462, and UI navigation device 1464 may be a touch screen display. The machine 1400 may additionally include a mass storage device (e.g., drive unit) 1451, a signal generation device 1468 (e.g., a speaker), a network interface device 1453, and one or more sensors 1466, such as a global positioning system (GPS) sensor, compass, accelerometer, or other sensor. The machine 1400 may include an output controller 1469, such as a serial (e.g., Universal Serial Bus (USB), parallel, or other wired or wireless (e.g., infrared (IR), near field communication (NFC), etc.) connection to communicate or control one or more peripheral devices (e.g., a printer, card reader, etc.).

The machine 1400 may include a machine-readable medium 1452 on which is stored one or more sets of data structures or instructions 1455 (e.g., software) embodying or utilized by the machine 1400 to perform any one or more of the techniques or functions for which the machine 1400 is designed. The instructions 1455 may also reside, completely or at least partially, within the main memory 1454, within static memory 1456, or within the hardware processor 1450 during execution thereof by the machine 1400. In an example, one or any combination of the hardware processor 1450, the main memory 1454, the static memory 1456, or the mass storage device 1451 may constitute the machine-readable medium 1452.

While the machine-readable medium 1452 is illustrated as a single medium, the term "machine-readable medium" may include a single medium or multiple media (e.g., a centralized or distributed database, or associated caches and servers) configured to store the one or more instructions 1455. The term "machine-readable medium" may include any medium that is capable of storing, encoding, or carrying instructions for execution by the machine 1400 and that cause the machine 1400 to perform any one or more of the techniques to which the machine 1400 is designed, or that is capable of storing, encoding or carrying data structures used by or associated with such instructions. Non-limiting machine-readable medium examples may include solid-state memories, and optical and magnetic media. In an example, a massed machine-readable medium comprises a machine-readable medium with a plurality of particles having invariant (e.g., rest) mass. Accordingly, massed machine-readable media are not transitory propagating signals. Specific examples of massed machine-readable media may include: non-volatile memory, such as semiconductor memory devices (e.g., EPROM, EEPROM) and flash memory devices; magnetic disks, such as internal hard disks and removable disks; magneto-optical disks; and compact disc-ROM (CD-ROM) and digital versatile disc-read only memory (DVD-ROM) disks.

The instructions 1455 (e.g., software, programs, an operating system (OS), etc.) or other data are stored on the mass storage device 1451, can be accessed by the main memory 1454 for use by the processor 1450. The main memory 1454 (e.g., DRAM) is typically fast, but volatile, and thus a different type of storage than the mass storage device 1451 (e.g., an SSD), which is suitable for long-term storage, including while in an "off" condition. The instructions 1455 or data in use by a user or the machine 1400 are typically loaded in the main memory 1454 for use by the processor 1450. When the main memory 1454 is full, virtual space from the mass storage device 1451 can be allocated to supplement the main memory 1454; however, because the mass storage device 1451 is typically slower than the main memory 1454, and write speeds are typically at least twice as slow as read speeds, use of virtual memory can greatly reduce user experience due to storage device latency (in contrast to the main memory 1454, e.g., DRAM). Further, use of the mass storage device 1451 for virtual memory can greatly reduce the usable lifespan of the mass storage device 1451.

In contrast to virtual memory, virtual memory compression (e.g., the Linux® kernel feature "ZRAM") uses part of the memory as compressed block storage to avoid paging to the mass storage device 1451. Paging takes place in the compressed block until it is necessary to write such data to the mass storage device 1451. Virtual memory compression increases the usable size of main memory 1454, while reducing wear on the mass storage device 1451.

Storage devices optimized for mobile electronic devices, or mobile storage, have traditionally included managed memory devices, such as MMC solid-state storage devices (e.g., micro Secure Digital (microSD™) cards, etc.); or SSDs. MMC devices include a number of parallel interfaces (e.g., an 8-bit parallel interface) with a host device and are often removable and separate components from the host device. In contrast, eMMC™ devices are attached to a circuit board and considered a component of the host device, with read speeds that rival SATA based SSD devices. However, demand for mobile device performance continues to increase, such as to fully enable virtual or augmented-reality devices, utilize increasing networks speeds, etc. In response to this demand, storage devices have shifted from parallel to serial communication interfaces. UFS devices, including controllers and firmware, communicate with a host device using a low-voltage differential signaling (LVDS) serial interface with dedicated read/write paths, further advancing greater read/write speeds.

The instructions 1455 may further be transmitted or received over a communications network 1459 using a transmission medium via the network interface device 1453 utilizing any one of a number of transfer protocols (e.g., frame relay, Internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device 1453 may include one or more physical jacks (e.g., Ethernet, coaxial, or phone jacks) or one or more antennas to connect to the communications network 1459. In an example, the network interface device 1453 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any tangible medium that is capable of carrying instructions to and for execution by the machine 1400, and includes instrumentalities to propagate digital or analog communications signals to facilitate communication of such instructions, which instructions may be implemented by software.

The following are example embodiments of devices and methods, in accordance with the teachings herein.

An example memory device 1 can comprise: a memory array having multiple strings and multiple data lines, each string including multiple memory cells; and a memory controller including processing circuitry including one or more processors, the memory controller configured to perform operations comprising: pre-charging a first data line of the multiple data lines prior to reading a memory cell of a string of the multiple strings, the string selectively coupled to the first data line during the reading of the memory cell, with adjacent data lines to the first data line configured as shielding lines to the first data line during the pre-charging and reading of the memory cell; and coupling the string to the first data line such that the string is enabled during the pre-charging of the first data line.

An example memory device 2 can include features of example memory device 1 and can include the string enabled during the pre-charging of the first data line remaining coupled to the first data line during a sensing phase that follows the pre-charging.

An example memory device 3 can include features of any of the preceding example memory devices and can include the pre-charging being a pre-charge phase during an initialization of the memory device.

An example memory device 4 can include features of any of the preceding example memory devices and can include the operations to include, during an initialization routine of the memory device, setting the memory device to operate with an architecture for the adjacent data lines to the first data line to operate as shielding lines to the first data line during pre-charging and sensing of the first data line.

An example memory device 5 can include features of example memory device 4 and any of the preceding example memory devices and can include the operations to include a hybrid initialization routine on an initialization block of the memory device, with the hybrid initialization routine including a sensing read routine corresponding to an all data line configuration of data lines of the memory device, a modified sensing read routine corresponding to a shielded data line configuration of the data lines with selected strings enabled during pre-charging, and a read retry routine associated with the modified sensing read routine.

An example memory device 6 can include features of any of the preceding example memory devices and can include the memory array being a three-dimensional array having an allocation of the memory array for initialization of the memory device.

In an example memory device 7, any of the memory devices of example memory devices 1 to 6 may include memory devices incorporated into an electronic memory apparatus further comprising a host processor and a communication bus extending between the host processor and the memory device.

In an example memory device 8, any of the memory devices of example memory devices 1 to 7 may be modified to include any structure presented in another of example memory device 1 to 7.

In an example memory device 9, any apparatus associated with the memory devices of example memory devices 1 to 8 may further include a machine-readable storage device configured to store instructions as a physical state, wherein the instructions may be used to perform one or more operations of the apparatus.

In an example memory device 10, any of the memory devices of example memory devices 1 to 9 may be operated in accordance with any of the methods of the below example methods 1 to 12.

An example memory device 11 can comprise: multiple data lines; multiple sense amplifiers coupled to the multiple data lines; a memory array having multiple strings with each string including multiple memory cells and a drain-side select gate (SGD), and a memory controller including processing circuitry including one or more processors, the memory controller configured to perform operations comprising: activating the SGD of a string of the multiple strings to couple the string to a first data line of the multiple data lines such that the string is enabled during a pre-charging of the first data line; and pre-charging the first data line, with the string enabled, prior to reading a memory cell of the string, with adjacent data lines to the first data line configured as shielding lines to the first data line during the pre-charging and reading of the memory cell.

An example memory device 12 can include features of example memory device 11 and can include the operations to include, during an initialization of the memory device, setting the memory device to operate with an architecture for the adjacent data lines to the first data line to operate as shielding lines to the first data line.

An example memory device 13 can include features of any of the preceding example memory devices 11 to 12 and can include the setting being in response to performance of an initialization routine on an initialization block of the memory array.

An example memory device 14 can include features of any of the preceding example memory devices 11 to 13 and can include the operations to include an initialization routine on an initialization block of the memory array, with the initialization block having multiple strings with each string having multiple memory cells, the initialization routine including: performance of a first sensing read routine on the initialization block with the first sensing read routine corresponding to an all data line configuration of the data lines such that a data line corresponding to a string of the initialization block and adjacent data lines to the data line are sensed simultaneously; and in response to a determination of a failure in the performance of the first sensing read routine, performance of a second sensing read routine on the initialization block with the second sensing read routine corresponding to a shielded data line configuration of data lines in which a data line, corresponding to a string of the initialization block, is pre-charged and sensed and adjacent data lines to the data line are configured as shielding lines to the data line during the pre-charging and sensing, with the string of the initialization block enabled during the pre-charging of the data line.

An example memory device 15 can include features of memory device 14 and any of the preceding example memory devices 11 to 13 and can include the initialization routine to include a read retry routine associated with the second sensing read routine, with the read retry routine having a maximum number of retries.

An example memory device 16 can include features of any of the preceding example memory devices 11 to 15 and can include the operations to include selectively coupling sense amplifiers of the multiple sense amplifiers to data lines of the multiple data lines to operate in a one-to-one configuration of sense amplifier to data line or selectively coupling sense amplifiers to data lines of the multiple data lines to operate in a one-to-two configuration of sense amplifier to data lines.

In an example memory device 17, any of the memory devices of example memory devices 11 to 16 may include memory devices incorporated into an electronic memory apparatus further comprising a host processor and a communication bus extending between the host processor and the memory device.

In an example memory device 18, any of the memory devices of example memory devices 11 to 17 may be modified to include any structure presented in another of example memory device 11 to 17.

In an example memory device 19, any of apparatus associated with the memory devices of example memory devices 11 to 18 may further include a machine-readable storage device configured to store instructions as a physical state, wherein the instructions may be used to perform one or more operations of the apparatus.

In an example memory device 20, any of the memory devices of example memory devices 11 to 19 may be operated in accordance with any of the methods of the following example methods 1 to 12.

An example method 1 of operating a memory device can comprise: performing a first sensing read routine on an initialization block of the memory device, the first sensing read routine corresponding to an all data line configuration of data lines of the memory device such that a data line corresponding to a string of the initialization block and adjacent data lines to the data line are sensed simultaneously; and in response to a determination of a failure in performing the first sensing read routine, performing a second sensing read routine on the initialization block, the second sensing read routine corresponding to a shielded data line configuration of the data lines in which a data line, corresponding to a string of the initialization block, is pre-charged and sensed and adjacent data lines to the data line are configured as shielding lines to the data line during the pre-charging and sensing, with the string of the initialization block enabled during the pre-charging of the data line.

An example method 2 of operating a memory device can include features of example method 1 of operating a memory device and can include maintaining the string, coupled to the data line, enabled during a sensing phase directly following the pre-charging.

An example method 3 of operating a memory device can include features of any of the preceding example methods of operating a memory device and can include, in response to a determination of a failure in performing the second sensing read routine, retrying the second sensing read routine.

An example method 4 of operating a memory device can include features of example method 3 of operating a memory device and any of the preceding example methods of operating a memory device and can include determining that a number of retries of the second sensing read routine equals a maximum number of retries and initiating a fail status routine in response to the determination.

An example method 5 of operating a memory device can include features of any of the preceding example methods of operating a memory device and can include modifying one or more trim values of the memory device in response to a determination of successful completion of the second sensing read routine on the initialization block.

An example method 6 of operating a memory device can include features of any of the preceding example methods of operating a memory device and can include modifying one or more trim values of the memory device after a number of reties of the second sensing read routine on the initialization block.

An example method 7 of operating a memory device can include features of any of the preceding example methods of operating a memory device and can include designating that the memory device is in condition to accept commands following a verification of a successful completion of the second sensing read routine that completes initialization of the memory device.

An example method 8 of operating a memory device can include features of example method 7 of operating a memory device or any of the preceding example methods of operating a memory device and can include performing the second sensing read routine in read operations of the memory device after completing initialization of the memory device.

In an example method 9 of operating a memory device, any of the example methods 1 to 8 of operating a memory device may be performed in an electronic memory apparatus further comprising a host processor and a communication bus extending between the host processor and the memory device.

In an example method 10 of operating a memory device, any of the example methods 1 to 9 of operating a memory device may be modified to include operations set forth in any other of method examples 1 to 9 of operating a memory device.

In an example method 11 of operating a memory device, any of the example methods 1 to 10 of operating a memory device may be implemented at least in part through use of instructions stored as a physical state in one or more machine-readable storage devices.

An example method 12 of operating a memory device can include features of any of the preceding example methods 1 to 11 of operating a memory device and can include performing functions associated with any features of example memory devices 1 to 20.

An example machine-readable storage device 1 storing instructions, that when executed by one or more processors, cause a machine to perform operations, can comprise instructions to perform functions associated with any features of example memory devices 1 to 10 and memory devices 11 to 20 or perform methods associated with any features of example methods 1 to 12.

Although specific embodiments have been illustrated and described herein, it will be appreciated by those of ordinary skill in the art that any arrangement that is calculated to achieve the same purpose may be substituted for the specific embodiments shown. Various embodiments use permutations and/or combinations of embodiments described herein. The above description is intended to be illustrative, and not restrictive, and that the phraseology or terminology employed herein is for the purpose of description. In addition, in the foregoing Detailed Description, it can be seen that various features are grouped together in a single embodiment for the purpose of streamlining the disclosure. Combinations of the above embodiments and other embodiments will be apparent to those of skill in the art upon studying the above description.

What is claimed is:

1. A memory device comprising:
    a memory array having multiple strings and multiple data lines, each string including multiple memory cells, with each memory cell of the multiple memory cells including a transistor arranged as a storage element; and
    a memory controller including processing circuitry including one or more processors, the memory controller configured to perform operations comprising:
        pre-charging a first data line of the multiple data lines prior to reading a memory cell of a string of the multiple strings, the string selectively coupled to the first data line during the reading of the memory cell, with adjacent data lines to the first data line operatively configured as shielding lines to the first data line, in a shielded bit line (SBL) sensing configuration, during the pre-charging and reading of the memory cell; and
        coupling the string to the first data line such that the string is enabled, to electrically couple the first data line to a source line through the string of the multiple strings, during the pre-charging of the first data line.

2. The memory device of claim 1, wherein the string enabled during the pre-charging of the first data line remains coupled to the first data line during a sensing phase that follows the pre-charging.

3. The memory device of claim 1, wherein the pre-charging is a pre-charge phase during an initialization of the memory device.

4. The memory device of claim 1, wherein the operations include, during an initialization routine of the memory device, setting the memory device to operate with an architecture for the adjacent data lines to the first data line to operate as shielding lines to the first data line during pre-charging and sensing of the first data line.

5. The memory device of claim 1, wherein the operations include a hybrid initialization routine on an initialization block of the memory device, with the hybrid initialization routine including a sensing read routine corresponding to an all data line configuration of data lines of the memory device, a modified sensing read routine corresponding to a shielded data line configuration of the data lines with selected strings enabled during pre-charging, and a read retry routine associated with the modified sensing read routine.

6. The memory device of claim 1, wherein the memory array is a three-dimensional array having an allocation of the memory array for initialization of the memory device.

7. A memory device comprising:
    multiple data lines;
    multiple sense amplifiers coupled to the multiple data lines;
    a memory array having multiple strings with each string including multiple memory cells and a drain-side select gate (SGD), with each memory cell of the multiple memory cells including a transistor arranged as a storage element; and
    a memory controller including processing circuitry including one or more processors, the memory controller configured to perform operations comprising:
        activating the SGD of a string of the multiple strings to couple the string to a first data line of the multiple data lines such that the string is enabled, to electrically couple the first data line to a source line through the string of the multiple strings, during a pre-charging of the first data line; and
        pre-charging the first data line, with the string enabled, prior to reading a memory cell of the string, with adjacent data lines to the first data line operatively configured as shielding lines to the first data line, in a shielded bit line (SBL) sensing configuration, during the pre-charging and reading of the memory cell.

8. The memory device of claim 7, wherein the operations include, during an initialization of the memory device, setting the memory device to operate with an architecture for the adjacent data lines to the first data line to operate as shielding lines to the first data line.

9. The memory device of claim 8, wherein the setting is in response to performance of an initialization routine on an initialization block of the memory array.

10. A memory device comprising:
    multiple data lines;
    multiple sense amplifiers coupled to the multiple data lines;
    a memory array having multiple strings with each string including multiple memory cells and a drain-side select gate (SGD); and
    a memory controller including processing circuitry including one or more processors, the memory controller configured to perform operations comprising:
        activating the SGD of a string of the multiple strings to couple the string to a first data line of the multiple data lines such that the string is enabled during a pre-charging of the first data line; and
        pre-charging the first data line, with the string enabled, prior to reading a memory cell of the string, with adjacent data lines to the first data line configured as shielding lines to the first data line during the pre-charging and reading of the memory cell, wherein the operations include an initialization routine on an initialization block of the memory array, with the initialization block having multiple strings with each string having multiple memory cells, the initialization routine including:
            performance of a first sensing read routine on the initialization block with the first sensing read routine corresponding to an all data line configuration of the data lines such that a data line corresponding to a string of the initialization block and adjacent data lines to the data line are sensed simultaneously; and
            in response to a determination of a failure in the performance of the first sensing read routine, performance of a second sensing read routine on the initialization block with the second sensing read routine corresponding to a shielded data line configuration of data lines in which a data line, corresponding to a string of the initialization block, is pre-charged and sensed and adjacent data lines to the data line are configured as shielding lines to the data line during the pre-charging and sensing, with the string of the initialization block enabled during the pre-charging of the data line.

11. The memory device of claim 10, wherein the initialization routine includes a read retry routine associated with the second sensing read routine, with the read retry routine having a maximum number of retries.

12. The memory device of claim 7, wherein the operations include selectively coupling sense amplifiers of the multiple sense amplifiers to data lines of the multiple data lines to operate in a one-to-one configuration of sense amplifier to data line or selectively coupling sense amplifiers to data lines of the multiple data lines to operate in a one-to-two configuration of sense amplifier to data lines.

13. A method of operating a memory device, the method comprising:
performing a first sensing read routine on an initialization block of the memory device, the first sensing read routine corresponding to an all data line configuration of data lines of the memory device such that a data line corresponding to a string of the initialization block and adjacent data lines to the data line are sensed simultaneously; and
in response to a determination of a failure in performing the first sensing read routine, performing a second sensing read routine on the initialization block, the second sensing read routine corresponding to a shielded data line configuration of the data lines in which a data line, corresponding to a string of the initialization block, is pre-charged and sensed and adjacent data lines to the data line are configured as shielding lines to the data line during the pre-charging and sensing, with the string of the initialization block enabled during the pre-charging of the data line.

14. The method of claim 13, wherein the method includes maintaining the string, coupled to the data line, enabled during a sensing phase directly following the pre-charging.

15. The method of claim 13, wherein in response to a determination of a failure in performing the second sensing read routine, retrying the second sensing read routine.

16. The method of claim 15, wherein the method includes determining that a number of retries of the second sensing read routine equals a maximum number of retries and initiating a fail status routine in response to the determination.

17. The method of claim 13, wherein the method includes modifying one or more trim values of the memory device in response to a determination of successful completion of the second sensing read routine on the initialization block.

18. The method of claim 13, wherein the method includes modifying one or more trim values of the memory device after a number of reties of the second sensing read routine on the initialization block.

19. The method of claim 13, wherein the method includes designating that the memory device is in condition to accept commands following a verification of a successful completion of the second sensing read routine that completes initialization of the memory device.

20. The method of claim 19, wherein the method includes performing the second sensing read routine in read operations of the memory device after completing initialization of the memory device.

* * * * *